(12) United States Patent
Bedworth et al.

(10) Patent No.: US 9,744,617 B2
(45) Date of Patent: Aug. 29, 2017

(54) METHODS FOR PERFORATING MULTI-LAYER GRAPHENE THROUGH ION BOMBARDMENT

(71) Applicant: LOCKHEED MARTIN CORPORATION, Bethesda, MD (US)

(72) Inventors: Peter V. Bedworth, Los Gatos, CA (US); Jacob L. Swett, Redwood City, CA (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 0 days.

(21) Appl. No.: 14/819,273

(22) Filed: Aug. 5, 2015

(65) Prior Publication Data
US 2015/0336202 A1 Nov. 26, 2015

Related U.S. Application Data

(63) Continuation-in-part of application No. 14/610,770, filed on Jan. 30, 2015.
(Continued)

(51) Int. Cl.
*G21K 5/00* (2006.01)
*B23K 15/08* (2006.01)
(Continued)

(52) U.S. Cl.
CPC .......... *B23K 15/085* (2013.01); *B23K 15/06* (2013.01); *C01B 31/0484* (2013.01);
(Continued)

(58) Field of Classification Search
CPC .......... B23K 15/08; B23K 15/06; C01B 31/04
(Continued)

(56) References Cited

U.S. PATENT DOCUMENTS

| 2,187,417 A | 1/1940 | Doble |
| 3,024,153 A | 3/1962 | Kennedy |

(Continued)

FOREIGN PATENT DOCUMENTS

| CA | 2037988 | 9/1992 |
| CA | 2411935 | 12/2002 |

(Continued)

OTHER PUBLICATIONS

Adiga et al., "Nanoporous Materials for Biomedical Devices," JOM 60: 26-32 (Mar. 25, 2008).
(Continued)

*Primary Examiner* — Nicole Ippolito
(74) *Attorney, Agent, or Firm* — Foley & Lardner LLP

(57) ABSTRACT

Multi-layer sheets of graphene-based material having a plurality of pores extending therethrough are described herein. Methods for making the sheets include exposing a graphene-based material comprising multilayer graphene having from 5 to 20 layers of graphene to a particle beam having an ion energy of at least about 1500 eV to create damage tracks in the graphene sheets. The damage tracks in the graphene sheets are then exposed to a chemical etchant, such as an oxidant to define pores through the stacked graphene sheets. Production of the damage tracks and etching of the damage tracks can take place while the graphene is disposed on a substrate.

16 Claims, 1 Drawing Sheet

Related U.S. Application Data

(60) Provisional application No. 62/039,856, filed on Aug. 20, 2014, provisional application No. 61/934,530, filed on Jan. 31, 2014.

(51) Int. Cl.
   *B23K 15/06*     (2006.01)
   *C01B 31/04*     (2006.01)
   *H01J 37/31*     (2006.01)
   *H01J 37/317*    (2006.01)

(52) U.S. Cl.
   CPC ............ *H01J 37/31* (2013.01); *H01J 37/317* (2013.01); *Y10T 428/24322* (2015.01)

(58) Field of Classification Search
   USPC .............................. 250/492.1, 492.2, 492.3
   See application file for complete search history.

(56) References Cited

U.S. PATENT DOCUMENTS

| | | |
|---|---|---|
| 3,303,085 A | 2/1967 | Price et al. |
| 3,501,831 A | 3/1970 | Gordon |
| 3,593,854 A | 7/1971 | Swank |
| 3,701,433 A | 10/1972 | Krakauer et al. |
| 3,802,972 A | 4/1974 | Fleischer et al. |
| 4,073,732 A | 2/1978 | Lauer et al. |
| 4,159,954 A | 7/1979 | Gangemi |
| 4,162,220 A | 7/1979 | Servas |
| 4,277,344 A | 7/1981 | Cadotte |
| 4,303,530 A | 12/1981 | Shah et al. |
| 4,743,371 A | 5/1988 | Servas et al. |
| 4,855,058 A | 8/1989 | Holland et al. |
| 4,880,440 A | 11/1989 | Perrin |
| 4,889,626 A | 12/1989 | Browne |
| 4,891,134 A | 1/1990 | Vcelka |
| 4,925,560 A | 5/1990 | Sorrick |
| 4,935,207 A | 6/1990 | Stanbro et al. |
| 4,976,858 A | 12/1990 | Kadoya |
| 5,052,444 A | 10/1991 | Messerly et al. |
| 5,080,770 A | 1/1992 | Culkin |
| 5,156,628 A | 10/1992 | Kranz |
| 5,182,111 A | 1/1993 | Aebischer et al. |
| 5,185,086 A | 2/1993 | Kaali et al. |
| 5,201,767 A | 4/1993 | Caldarise et al. |
| 5,244,981 A | 9/1993 | Seidner et al. |
| 5,314,492 A | 5/1994 | Hamilton et al. |
| 5,314,960 A | 5/1994 | Spinelli et al. |
| 5,314,961 A | 5/1994 | Anton et al. |
| 5,331,067 A | 7/1994 | Seidner et al. |
| 5,344,454 A | 9/1994 | Clarke et al. |
| 5,371,147 A | 12/1994 | Spinelli et al. |
| 5,425,858 A | 6/1995 | Farmer |
| 5,480,449 A | 1/1996 | Hamilton et al. |
| 5,514,181 A | 5/1996 | Light et al. |
| 5,516,522 A | 5/1996 | Peyman et al. |
| 5,549,697 A | 8/1996 | Caldarise |
| 5,562,944 A | 10/1996 | Kafrawy |
| 5,565,210 A | 10/1996 | Rosenthal et al. |
| 5,580,530 A | 12/1996 | Kowatsch et al. |
| 5,595,621 A | 1/1997 | Light et al. |
| 5,636,437 A | 6/1997 | Kaschmitter et al. |
| 5,639,275 A | 6/1997 | Baetge et al. |
| 5,641,323 A | 6/1997 | Caldarise |
| 5,658,334 A | 8/1997 | Caldarise et al. |
| 5,662,158 A | 9/1997 | Caldarise |
| 5,665,118 A | 9/1997 | LaSalle et al. |
| 5,671,897 A | 9/1997 | Ogg et al. |
| 5,679,232 A | 10/1997 | Fedor et al. |
| 5,679,249 A | 10/1997 | Fendya et al. |
| 5,687,788 A | 11/1997 | Caldarise et al. |
| 5,700,477 A | 12/1997 | Rosenthal et al. |
| 5,713,410 A | 2/1998 | LaSalle et al. |
| 5,716,412 A | 2/1998 | DeCarlo et al. |
| 5,716,414 A | 2/1998 | Caldarise |
| 5,725,586 A | 3/1998 | Sommerich |
| 5,731,360 A | 3/1998 | Pekala et al. |
| 5,733,503 A | 3/1998 | Kowatsch et al. |
| 5,746,272 A | 5/1998 | Mastrorio et al. |
| 5,782,286 A | 7/1998 | Sommerich |
| 5,782,289 A | 7/1998 | Mastrorio et al. |
| 5,788,916 A | 8/1998 | Caldarise |
| 5,800,828 A | 9/1998 | Dionne et al. |
| 5,808,312 A | 9/1998 | Fukuda |
| 5,868,727 A | 2/1999 | Barr et al. |
| 5,897,592 A | 4/1999 | Caldarise et al. |
| 5,902,762 A | 5/1999 | Mercuri et al. |
| 5,906,234 A | 5/1999 | Mastrorio et al. |
| 5,910,172 A | 6/1999 | Penenberg |
| 5,910,173 A | 6/1999 | DeCarlo et al. |
| 5,913,998 A | 6/1999 | Butler et al. |
| 5,925,247 A | 7/1999 | Huebbel |
| 5,932,185 A | 8/1999 | Pekala et al. |
| 5,935,084 A | 8/1999 | Southworth |
| 5,935,172 A | 8/1999 | Ochoa et al. |
| 5,954,937 A | 9/1999 | Farmer |
| 5,974,973 A | 11/1999 | Tittgemeyer |
| 5,976,555 A | 11/1999 | Liu et al. |
| 5,980,718 A | 11/1999 | Van Konynenburg et al. |
| 6,008,431 A | 12/1999 | Caldarise et al. |
| 6,013,080 A | 1/2000 | Khalili |
| 6,022,509 A | 2/2000 | Matthews et al. |
| 6,052,608 A | 4/2000 | Young et al. |
| 6,080,393 A | 6/2000 | Liu et al. |
| 6,093,209 A | 7/2000 | Sanders |
| 6,139,585 A | 10/2000 | Li |
| 6,152,882 A | 11/2000 | Prutchi |
| 6,156,323 A | 12/2000 | Verdicchio et al. |
| 6,193,956 B1 | 2/2001 | Liu et al. |
| 6,209,621 B1 | 4/2001 | Treacy |
| 6,213,124 B1 | 4/2001 | Butterworth |
| 6,228,123 B1 | 5/2001 | Dezzani |
| 6,264,699 B1 | 7/2001 | Noiles et al. |
| 6,292,704 B1 | 9/2001 | Malonek et al. |
| 6,309,532 B1 | 10/2001 | Tran et al. |
| 6,346,187 B1 | 2/2002 | Tran et al. |
| 6,375,014 B1 | 4/2002 | Garcera et al. |
| 6,426,214 B1 | 7/2002 | Butler et al. |
| 6,454,095 B1 | 9/2002 | Brisebois et al. |
| 6,455,115 B1 | 9/2002 | DeMeyer |
| 6,461,622 B2 | 10/2002 | Liu et al. |
| 6,462,935 B1 | 10/2002 | Shiue et al. |
| 6,521,865 B1 | 2/2003 | Jones et al. |
| 6,532,386 B2 | 3/2003 | Sun et al. |
| 6,580,598 B2 | 6/2003 | Shiue et al. |
| 6,654,229 B2 | 11/2003 | Yanagisawa et al. |
| 6,659,298 B2 | 12/2003 | Wong |
| 6,660,150 B2 | 12/2003 | Conlan et al. |
| 6,661,643 B2 | 12/2003 | Shiue et al. |
| 6,692,627 B1 | 2/2004 | Russell et al. |
| 6,695,880 B1 | 2/2004 | Roffman et al. |
| 6,699,684 B2 | 3/2004 | Ho et al. |
| 6,719,740 B2 | 4/2004 | Burnett et al. |
| 6,905,612 B2 | 6/2005 | Dorian et al. |
| 6,924,190 B2 | 8/2005 | Dennison |
| 7,014,829 B2 | 3/2006 | Yanagisawa et al. |
| 7,071,406 B2 | 7/2006 | Smalley et al. |
| 7,092,753 B2 | 8/2006 | Darvish et al. |
| 7,138,042 B2 | 11/2006 | Tran et al. |
| 7,171,263 B2 | 1/2007 | Darvish et al. |
| 7,175,783 B2 | 2/2007 | Curran |
| 7,179,419 B2 | 2/2007 | Lin et al. |
| 7,190,997 B1 | 3/2007 | Darvish et al. |
| 7,267,753 B2 | 9/2007 | Anex et al. |
| 7,306,768 B2 | 12/2007 | Chiga |
| 7,357,255 B2 | 4/2008 | Ginsberg et al. |
| 7,374,677 B2 | 5/2008 | McLaughlin et al. |
| 7,381,707 B2 | 6/2008 | Lin et al. |
| 7,382,601 B2 | 6/2008 | Yoshimitsu |
| 7,434,692 B2 | 10/2008 | Ginsberg et al. |
| 7,452,547 B2 | 11/2008 | Lambino et al. |
| 7,459,121 B2 | 12/2008 | Liang et al. |
| 7,460,907 B1 | 12/2008 | Darvish et al. |
| 7,476,222 B2 | 1/2009 | Sun et al. |

(56) References Cited

U.S. PATENT DOCUMENTS

| | | |
|---|---|---|
| 7,477,939 B2 | 1/2009 | Sun et al. |
| 7,477,940 B2 | 1/2009 | Sun et al. |
| 7,477,941 B2 | 1/2009 | Sun et al. |
| 7,479,133 B2 | 1/2009 | Sun et al. |
| 7,505,250 B2 | 3/2009 | Cho et al. |
| 7,531,094 B2 | 5/2009 | McLaughlin et al. |
| 7,600,567 B2 | 10/2009 | Christopher et al. |
| 7,631,764 B2 | 12/2009 | Ginsberg et al. |
| 7,650,805 B2 | 1/2010 | Nauseda et al. |
| 7,674,477 B1 | 3/2010 | Schmid et al. |
| 7,706,128 B2 | 4/2010 | Bourcier |
| 7,761,809 B2 | 7/2010 | Bukovec et al. |
| 7,786,086 B2 | 8/2010 | Reches et al. |
| 7,866,475 B2 | 1/2011 | Doskoczynski et al. |
| 7,875,293 B2 | 1/2011 | Shults et al. |
| 7,935,331 B2 | 5/2011 | Lin |
| 7,935,416 B2 | 5/2011 | Yang et al. |
| 7,943,167 B2 | 5/2011 | Kulkarni et al. |
| 7,960,708 B2 | 6/2011 | Wolfe et al. |
| 7,998,246 B2 | 8/2011 | Liu et al. |
| 8,109,893 B2 | 2/2012 | Lande |
| 8,147,599 B2 | 4/2012 | McAlister |
| 8,262,943 B2 | 9/2012 | Meng et al. |
| 8,308,702 B2 | 11/2012 | Batchvarova et al. |
| 8,316,865 B2 | 11/2012 | Ochs et al. |
| 8,329,476 B2 | 12/2012 | Pitkanen et al. |
| 8,361,321 B2 | 1/2013 | Stetson et al. |
| 8,449,504 B2 | 5/2013 | Carter et al. |
| 8,475,689 B2 | 7/2013 | Sun et al. |
| 8,506,807 B2 | 8/2013 | Lee et al. |
| 8,512,669 B2 | 8/2013 | Hauck |
| 8,513,324 B2 | 8/2013 | Scales et al. |
| 8,535,726 B2 | 9/2013 | Dai et al. |
| 8,592,291 B2 | 11/2013 | Shi et al. |
| 8,617,411 B2 | 12/2013 | Singh |
| 8,666,471 B2 | 3/2014 | Rogers et al. |
| 8,686,249 B1 | 4/2014 | Whitaker et al. |
| 8,697,230 B2 | 4/2014 | Ago et al. |
| 8,698,481 B2 | 4/2014 | Lieber et al. |
| 8,715,329 B2 | 5/2014 | Robinson et al. |
| 8,721,074 B2 | 5/2014 | Pugh et al. |
| 8,734,421 B2 | 5/2014 | Sun et al. |
| 8,744,567 B2 | 6/2014 | Fassih et al. |
| 8,751,015 B2 | 6/2014 | Frewin et al. |
| 8,753,468 B2 | 6/2014 | Caldwell et al. |
| 8,759,153 B2 | 6/2014 | Elian et al. |
| 8,808,257 B2 | 8/2014 | Pugh et al. |
| 8,828,211 B2 | 9/2014 | Garaj et al. |
| 8,840,552 B2 | 9/2014 | Brauker et al. |
| 8,857,983 B2 | 10/2014 | Pugh et al. |
| 8,861,821 B2 | 10/2014 | Osumi |
| 8,894,201 B2 | 11/2014 | Pugh et al. |
| 8,940,552 B2 | 1/2015 | Pugh et al. |
| 8,950,862 B2 | 2/2015 | Pugh et al. |
| 8,974,055 B2 | 3/2015 | Pugh et al. |
| 8,975,121 B2 | 3/2015 | Pugh et al. |
| 8,979,978 B2 | 3/2015 | Miller et al. |
| 8,986,932 B2 | 3/2015 | Turner et al. |
| 8,993,234 B2 | 3/2015 | Turner et al. |
| 8,993,327 B2 | 3/2015 | McKnight et al. |
| 9,014,639 B2 | 4/2015 | Pugh et al. |
| 9,017,937 B1 | 4/2015 | Turner et al. |
| 9,023,220 B2 | 5/2015 | Zurutuza Elorza et al. |
| 9,028,663 B2 | 5/2015 | Stetson et al. |
| 9,035,282 B2 | 5/2015 | Dimitrakopoulos et al. |
| 9,045,847 B2 | 6/2015 | Batchvarova et al. |
| 9,050,452 B2 | 6/2015 | Sun et al. |
| 9,052,533 B2 | 6/2015 | Pugh et al. |
| 9,056,282 B2 | 6/2015 | Miller et al. |
| 9,062,180 B2 | 6/2015 | Scales et al. |
| 9,067,811 B1 | 6/2015 | Bennett et al. |
| 9,070,615 B2 | 6/2015 | Elian et al. |
| 9,075,009 B2 | 7/2015 | Kim et al. |
| 9,080,267 B2 | 7/2015 | Batchvarova et al. |
| 9,095,823 B2 | 8/2015 | Fleming |
| 9,096,050 B2 | 8/2015 | Bedell et al. |
| 9,096,437 B2 | 8/2015 | Tour et al. |
| 9,102,111 B2 | 8/2015 | Pugh et al. |
| 9,108,158 B2 | 8/2015 | Yu et al. |
| 9,110,310 B2 | 8/2015 | Pugh et al. |
| 9,125,715 B2 | 9/2015 | Pugh et al. |
| 9,134,546 B2 | 9/2015 | Pugh et al. |
| 9,170,646 B2 | 10/2015 | Toner et al. |
| 9,185,486 B2 | 11/2015 | Pugh |
| 9,193,587 B2 | 11/2015 | Bennett |
| 9,195,075 B2 | 11/2015 | Pugh et al. |
| 9,225,375 B2 | 12/2015 | Pugh et al. |
| 9,388,048 B1 | 7/2016 | Zhou et al. |
| 9,425,709 B2 | 8/2016 | Hayashi et al. |
| 9,463,421 B2 | 10/2016 | Fleming |
| 9,475,709 B2 | 10/2016 | Stetson et al. |
| 9,505,192 B2 | 11/2016 | Stoltenberg et al. |
| 9,567,224 B2 | 2/2017 | Bedworth |
| 9,572,918 B2 | 2/2017 | Bachmann et al. |
| 9,610,546 B2 | 4/2017 | Sinton et al. |
| 2001/0036556 A1 | 11/2001 | Jen |
| 2001/0047157 A1 | 11/2001 | Burnett |
| 2001/0055597 A1 | 12/2001 | Liu et al. |
| 2002/0079004 A1 | 6/2002 | Sato et al. |
| 2002/0079054 A1 | 6/2002 | Nakatani |
| 2002/0104435 A1 | 8/2002 | Baker et al. |
| 2002/0115957 A1 | 8/2002 | Sun et al. |
| 2002/0183682 A1 | 12/2002 | Darvish et al. |
| 2002/0183686 A1 | 12/2002 | Darvish et al. |
| 2003/0052354 A1 | 3/2003 | Dennison |
| 2003/0134281 A1 | 7/2003 | Evans |
| 2003/0138777 A1 | 7/2003 | Evans |
| 2003/0159985 A1 | 8/2003 | Siwy et al. |
| 2004/0061253 A1 | 4/2004 | Kleinmeyer et al. |
| 2004/0063097 A1 | 4/2004 | Evans |
| 2004/0099324 A1 | 5/2004 | Fraser et al. |
| 2004/0111968 A1 | 6/2004 | Day et al. |
| 2004/0112865 A1 | 6/2004 | McCullough et al. |
| 2004/0121488 A1 | 6/2004 | Chang et al. |
| 2004/0142463 A1 | 7/2004 | Walker et al. |
| 2004/0185730 A1 | 9/2004 | Lambino et al. |
| 2004/0193043 A1 | 9/2004 | Duchon et al. |
| 2004/0199243 A1 | 10/2004 | Yodfat |
| 2004/0217036 A1 | 11/2004 | Ginsberg et al. |
| 2004/0241214 A1 | 12/2004 | Kirkwood et al. |
| 2004/0251136 A1 | 12/2004 | Lean et al. |
| 2005/0004508 A1 | 1/2005 | Sun et al. |
| 2005/0004509 A1 | 1/2005 | Sun et al. |
| 2005/0004550 A1 | 1/2005 | Sun et al. |
| 2005/0010161 A1 | 1/2005 | Sun et al. |
| 2005/0010192 A1 | 1/2005 | Sun et al. |
| 2005/0015042 A1 | 1/2005 | Sun et al. |
| 2005/0053563 A1 | 3/2005 | Manissier et al. |
| 2005/0112078 A1 | 5/2005 | Boddupalli et al. |
| 2005/0126966 A1 | 6/2005 | Tanida et al. |
| 2005/0129633 A1 | 6/2005 | Lin |
| 2005/0148996 A1 | 7/2005 | Sun et al. |
| 2005/0170089 A1 | 8/2005 | Lashmore et al. |
| 2005/0189673 A1 | 9/2005 | Klug et al. |
| 2005/0226834 A1 | 10/2005 | Lambino et al. |
| 2005/0238730 A1 | 10/2005 | Le Fur et al. |
| 2006/0005381 A1 | 1/2006 | Nishi et al. |
| 2006/0036332 A1 | 2/2006 | Jennings |
| 2006/0073370 A1 | 4/2006 | Krusic et al. |
| 2006/0093885 A1 | 5/2006 | Krusic et al. |
| 2006/0121279 A1 | 6/2006 | Petrik |
| 2006/0151382 A1 | 7/2006 | Petrik |
| 2006/0166347 A1 | 7/2006 | Faulstich et al. |
| 2006/0180604 A1 | 8/2006 | Ginsberg et al. |
| 2006/0222701 A1 | 10/2006 | Kulkarni et al. |
| 2006/0253078 A1 | 11/2006 | Wu et al. |
| 2007/0004640 A1 | 1/2007 | Lin et al. |
| 2007/0032054 A1 | 2/2007 | Ramaswamy et al. |
| 2007/0056894 A1 | 3/2007 | Connors |
| 2007/0060862 A1 | 3/2007 | Sun et al. |
| 2007/0062856 A1 | 3/2007 | Pahl et al. |
| 2007/0099813 A1 | 5/2007 | Luizzi et al. |
| 2007/0131646 A1 | 6/2007 | Donnelly et al. |
| 2007/0284279 A1 | 12/2007 | Doskoczynski et al. |

(56) References Cited

U.S. PATENT DOCUMENTS

| | | |
|---|---|---|
| 2008/0017564 A1 | 1/2008 | Hammond |
| 2008/0035484 A1 | 2/2008 | Wu et al. |
| 2008/0035541 A1 | 2/2008 | Franzreb et al. |
| 2008/0045877 A1 | 2/2008 | Levin et al. |
| 2008/0061477 A1 | 3/2008 | Capizzo |
| 2008/0063585 A1 | 3/2008 | Smalley et al. |
| 2008/0081323 A1 | 4/2008 | Keeley et al. |
| 2008/0081362 A1 | 4/2008 | Keeley et al. |
| 2008/0149561 A1 | 6/2008 | Chu et al. |
| 2008/0156648 A1 | 7/2008 | Dudziak et al. |
| 2008/0170982 A1 | 7/2008 | Zhang et al. |
| 2008/0185293 A1 | 8/2008 | Klose et al. |
| 2008/0188836 A1 | 8/2008 | Weber et al. |
| 2008/0190508 A1 | 8/2008 | Booth et al. |
| 2008/0241085 A1 | 10/2008 | Lin et al. |
| 2008/0268016 A1 | 10/2008 | Fang et al. |
| 2008/0290020 A1 | 11/2008 | Marand et al. |
| 2008/0290111 A1 | 11/2008 | Ginsberg et al. |
| 2009/0023572 A1 | 1/2009 | Backes et al. |
| 2009/0039019 A1 | 2/2009 | Raman |
| 2009/0048685 A1 | 2/2009 | Frigstad et al. |
| 2009/0075371 A1 | 3/2009 | Keeley et al. |
| 2009/0087395 A1 | 4/2009 | Lin et al. |
| 2009/0117335 A1 | 5/2009 | Iyoda et al. |
| 2009/0148495 A1 | 6/2009 | Hammer et al. |
| 2009/0176159 A1 | 7/2009 | Zhamu et al. |
| 2009/0222072 A1 | 9/2009 | Robinson et al. |
| 2009/0236295 A1 | 9/2009 | Braun et al. |
| 2009/0241242 A1 | 10/2009 | Beatty et al. |
| 2009/0283475 A1 | 11/2009 | Hylton et al. |
| 2009/0291270 A1 | 11/2009 | Zettl et al. |
| 2009/0294300 A1 | 12/2009 | Kanzius et al. |
| 2009/0306364 A1 | 12/2009 | Beer et al. |
| 2010/0000754 A1 | 1/2010 | Mann et al. |
| 2010/0016778 A1 | 1/2010 | Chattopadhyay |
| 2010/0021708 A1 | 1/2010 | Kong et al. |
| 2010/0024722 A1 | 2/2010 | Ochs et al. |
| 2010/0024838 A1 | 2/2010 | Ochs et al. |
| 2010/0025330 A1 | 2/2010 | Ratto et al. |
| 2010/0055464 A1 | 3/2010 | Sung |
| 2010/0059378 A1 | 3/2010 | Elson et al. |
| 2010/0072643 A1 | 3/2010 | Pugh et al. |
| 2010/0076553 A1 | 3/2010 | Pugh et al. |
| 2010/0105834 A1 | 4/2010 | Tour et al. |
| 2010/0110372 A1 | 5/2010 | Pugh et al. |
| 2010/0124564 A1 | 5/2010 | Martinson et al. |
| 2010/0127312 A1 | 5/2010 | Grebel et al. |
| 2010/0161014 A1 | 6/2010 | Lynch et al. |
| 2010/0167551 A1 | 7/2010 | Dedontney |
| 2010/0196439 A1 | 8/2010 | Beck et al. |
| 2010/0209515 A1 | 8/2010 | Chantalat et al. |
| 2010/0213079 A1 | 8/2010 | Willis |
| 2010/0228204 A1 | 9/2010 | Beatty et al. |
| 2010/0233781 A1 | 9/2010 | Bangera et al. |
| 2010/0249273 A1 | 9/2010 | Scales et al. |
| 2010/0258111 A1 | 10/2010 | Shah et al. |
| 2010/0323177 A1 | 12/2010 | Ruoff et al. |
| 2010/0327847 A1 | 12/2010 | Leiber et al. |
| 2011/0014217 A1 | 1/2011 | Fahmy et al. |
| 2011/0037033 A1 | 2/2011 | Green et al. |
| 2011/0041519 A1 | 2/2011 | Mcalister |
| 2011/0041687 A1 | 2/2011 | Diaz et al. |
| 2011/0045523 A1 | 2/2011 | Strano et al. |
| 2011/0054418 A1 | 3/2011 | Pugh et al. |
| 2011/0054576 A1 | 3/2011 | Robinson et al. |
| 2011/0056892 A1 | 3/2011 | Strauss et al. |
| 2011/0073563 A1 | 3/2011 | Chang et al. |
| 2011/0092949 A1 | 4/2011 | Wang |
| 2011/0100921 A1 | 5/2011 | Heinrich |
| 2011/0112484 A1 | 5/2011 | Carter et al. |
| 2011/0118655 A1 | 5/2011 | Fassih et al. |
| 2011/0120970 A1 | 5/2011 | Joo et al. |
| 2011/0124253 A1 | 5/2011 | Shah et al. |
| 2011/0139707 A1 | 6/2011 | Siwy et al. |
| 2011/0152795 A1 | 6/2011 | Aledo et al. |
| 2011/0201201 A1 | 8/2011 | Arnold et al. |
| 2011/0202201 A1 | 8/2011 | Matsubara |
| 2011/0258791 A1 | 10/2011 | Batchvarova et al. |
| 2011/0258796 A1 | 10/2011 | Batchvarova et al. |
| 2011/0262645 A1 | 10/2011 | Batchvarova et al. |
| 2011/0263912 A1 | 10/2011 | Miller et al. |
| 2011/0269920 A1 | 11/2011 | Min et al. |
| 2012/0031833 A1 | 2/2012 | Ho et al. |
| 2012/0048804 A1 | 3/2012 | Stetson et al. |
| 2012/0116228 A1 | 5/2012 | Okubo |
| 2012/0145548 A1 | 6/2012 | Sivan et al. |
| 2012/0148633 A1 | 6/2012 | Sun et al. |
| 2012/0162600 A1 | 6/2012 | Pugh et al. |
| 2012/0183738 A1 | 7/2012 | Zettl et al. |
| 2012/0186850 A1 | 7/2012 | Sugiyama et al. |
| 2012/0211367 A1 | 8/2012 | Vecitis |
| 2012/0218508 A1 | 8/2012 | Pugh et al. |
| 2012/0220053 A1 | 8/2012 | Lee et al. |
| 2012/0234453 A1 | 9/2012 | Pugh et al. |
| 2012/0234679 A1 | 9/2012 | Garaj et al. |
| 2012/0235277 A1 | 9/2012 | Pugh et al. |
| 2012/0236254 A1 | 9/2012 | Pugh et al. |
| 2012/0236524 A1 | 9/2012 | Pugh et al. |
| 2012/0242953 A1 | 9/2012 | Pugh et al. |
| 2012/0255899 A1 | 10/2012 | Choi et al. |
| 2012/0267337 A1 | 10/2012 | Striemer et al. |
| 2012/0292245 A1 | 11/2012 | Saito |
| 2012/0298396 A1 | 11/2012 | Hong et al. |
| 2013/0015136 A1 | 1/2013 | Bennett |
| 2013/0034760 A1 | 2/2013 | Otts et al. |
| 2013/0045523 A1 | 2/2013 | Leach et al. |
| 2013/0056367 A1 | 3/2013 | Martinez et al. |
| 2013/0071941 A1 | 3/2013 | Miller |
| 2013/0096292 A1 | 4/2013 | Brahmasandra et al. |
| 2013/0100436 A1 | 4/2013 | Jackson et al. |
| 2013/0105417 A1 | 5/2013 | Stetson et al. |
| 2013/0116541 A1 | 5/2013 | Gracias et al. |
| 2013/0131214 A1 | 5/2013 | Scales et al. |
| 2013/0135578 A1 | 5/2013 | Pugh et al. |
| 2013/0146221 A1 | 6/2013 | Kolmakov et al. |
| 2013/0146480 A1 | 6/2013 | Garaj et al. |
| 2013/0152386 A1 | 6/2013 | Pandojirao-S et al. |
| 2013/0174978 A1 | 7/2013 | Pugh et al. |
| 2013/0190476 A1 | 7/2013 | Lancaster et al. |
| 2013/0192460 A1 | 8/2013 | Miller et al. |
| 2013/0192461 A1 | 8/2013 | Miller et al. |
| 2013/0194540 A1 | 8/2013 | Pugh et al. |
| 2013/0213568 A1 | 8/2013 | Pugh et al. |
| 2013/0215377 A1 | 8/2013 | Pugh et al. |
| 2013/0215378 A1 | 8/2013 | Pugh et al. |
| 2013/0215380 A1 | 8/2013 | Pugh et al. |
| 2013/0216581 A1 | 8/2013 | Fahmy et al. |
| 2013/0240355 A1 | 9/2013 | Ho et al. |
| 2013/0240437 A1 | 9/2013 | Rodrigues et al. |
| 2013/0248097 A1 | 9/2013 | Ploss, Jr. |
| 2013/0248367 A1 | 9/2013 | Stetson et al. |
| 2013/0249147 A1 | 9/2013 | Bedworth |
| 2013/0256118 A1 | 10/2013 | Meller et al. |
| 2013/0256139 A1 | 10/2013 | Peng |
| 2013/0256154 A1 | 10/2013 | Peng |
| 2013/0256210 A1 | 10/2013 | Fleming |
| 2013/0256211 A1 | 10/2013 | Fleming |
| 2013/0261568 A1 | 10/2013 | Martinson et al. |
| 2013/0269819 A1 | 10/2013 | Ruby et al. |
| 2013/0270188 A1* | 10/2013 | Karnik ............... B01D 53/228 210/650 |
| 2013/0273288 A1 | 10/2013 | Luo et al. |
| 2013/0277305 A1 | 10/2013 | Stetson et al. |
| 2013/0295150 A1 | 11/2013 | Chantalat et al. |
| 2013/0309776 A1 | 11/2013 | Drndic et al. |
| 2013/0317131 A1 | 11/2013 | Scales et al. |
| 2013/0317132 A1 | 11/2013 | Scales et al. |
| 2013/0317133 A1 | 11/2013 | Scales et al. |
| 2013/0323295 A1 | 12/2013 | Scales et al. |
| 2013/0338611 A1 | 12/2013 | Pugh et al. |
| 2013/0338744 A1 | 12/2013 | Frewin et al. |
| 2014/0002788 A1 | 1/2014 | Otts et al. |
| 2014/0005514 A1 | 1/2014 | Pugh et al. |
| 2014/0015160 A1 | 1/2014 | Kung et al. |

(56) References Cited

U.S. PATENT DOCUMENTS

| | | |
|---|---|---|
| 2014/0017322 A1 | 1/2014 | Dai et al. |
| 2014/0066958 A1 | 3/2014 | Priewe |
| 2014/0079936 A1 | 3/2014 | Russo et al. |
| 2014/0093728 A1 | 4/2014 | Shah et al. |
| 2014/0128891 A1 | 5/2014 | Astani-Matthies et al. |
| 2014/0141521 A1 | 5/2014 | Peng et al. |
| 2014/0151288 A1 | 6/2014 | Miller et al. |
| 2014/0151631 A1 | 6/2014 | Duesberg et al. |
| 2014/0154464 A1 | 6/2014 | Miller et al. |
| 2014/0170195 A1 | 6/2014 | Fassih et al. |
| 2014/0171541 A1 | 6/2014 | Scales et al. |
| 2014/0174927 A1 | 6/2014 | Bashir et al. |
| 2014/0190004 A1 | 7/2014 | Riall et al. |
| 2014/0190550 A1 | 7/2014 | Loh et al. |
| 2014/0190676 A1 | 7/2014 | Zhamu et al. |
| 2014/0192313 A1 | 7/2014 | Riall et al. |
| 2014/0192314 A1 | 7/2014 | Riall et al. |
| 2014/0199777 A2 | 7/2014 | Ruiz et al. |
| 2014/0212596 A1 | 7/2014 | Jahangiri-Famenini |
| 2014/0230653 A1 | 8/2014 | Yu et al. |
| 2014/0230733 A1 | 8/2014 | Miller |
| 2014/0231351 A1 | 8/2014 | Wickramasinghe et al. |
| 2014/0248621 A1 | 9/2014 | Collins |
| 2014/0257348 A1 | 9/2014 | Priewe et al. |
| 2014/0257517 A1 | 9/2014 | Deichmann et al. |
| 2014/0259657 A1 | 9/2014 | Riall et al. |
| 2014/0261999 A1 | 9/2014 | Stetson et al. |
| 2014/0263035 A1 | 9/2014 | Stoltenberg et al. |
| 2014/0263178 A1 | 9/2014 | Sinton et al. |
| 2014/0264977 A1 | 9/2014 | Pugh et al. |
| 2014/0268015 A1 | 9/2014 | Riall et al. |
| 2014/0268020 A1 | 9/2014 | Pugh et al. |
| 2014/0268021 A1 | 9/2014 | Pugh et al. |
| 2014/0268026 A1 | 9/2014 | Pugh et al. |
| 2014/0272286 A1 | 9/2014 | Stoltenberg et al. |
| 2014/0272522 A1 | 9/2014 | Pugh et al. |
| 2014/0273315 A1 | 9/2014 | Pugh et al. |
| 2014/0273316 A1 | 9/2014 | Pugh et al. |
| 2014/0276481 A1 | 9/2014 | Pugh et al. |
| 2014/0276999 A1 | 9/2014 | Harms et al. |
| 2014/0306361 A1 | 10/2014 | Pugh et al. |
| 2014/0308681 A1 | 10/2014 | Strano et al. |
| 2014/0315213 A1 | 10/2014 | Nagrath et al. |
| 2014/0318373 A1 | 10/2014 | Wood et al. |
| 2014/0322518 A1 | 10/2014 | Addleman et al. |
| 2014/0333892 A1 | 11/2014 | Pugh et al. |
| 2014/0335661 A1 | 11/2014 | Pugh et al. |
| 2014/0343580 A1 | 11/2014 | Priewe |
| 2014/0346081 A1 | 11/2014 | Sowden et al. |
| 2014/0349892 A1 | 11/2014 | Van Der Zaag et al. |
| 2014/0350372 A1 | 11/2014 | Pugh et al. |
| 2014/0377651 A1 | 12/2014 | Kwon et al. |
| 2014/0377738 A1 | 12/2014 | Bachmann et al. |
| 2015/0015843 A1 | 1/2015 | Pugh et al. |
| 2015/0017918 A1 | 1/2015 | Pugh et al. |
| 2015/0057762 A1 | 2/2015 | Harms et al. |
| 2015/0061990 A1 | 3/2015 | Toner et al. |
| 2015/0062533 A1 | 3/2015 | Toner et al. |
| 2015/0063605 A1 | 3/2015 | Pugh |
| 2015/0066063 A1 | 3/2015 | Priewe |
| 2015/0075667 A1 | 3/2015 | McHugh et al. |
| 2015/0077658 A1 | 3/2015 | Pugh et al. |
| 2015/0077659 A1 | 3/2015 | Pugh et al. |
| 2015/0077660 A1 | 3/2015 | Pugh et al. |
| 2015/0077661 A1 | 3/2015 | Pugh et al. |
| 2015/0077662 A1 | 3/2015 | Pugh et al. |
| 2015/0077663 A1 | 3/2015 | Pugh et al. |
| 2015/0077699 A1 | 3/2015 | De Sio et al. |
| 2015/0077702 A9 | 3/2015 | Pugh et al. |
| 2015/0079683 A1 | 3/2015 | Yager et al. |
| 2015/0087249 A1 | 3/2015 | Pugh et al. |
| 2015/0098910 A1 | 4/2015 | Mordas et al. |
| 2015/0101931 A1 | 4/2015 | Garaj et al. |
| 2015/0105686 A1 | 4/2015 | Vasan |
| 2015/0118318 A1 | 4/2015 | Fahmy et al. |
| 2015/0122727 A1 | 5/2015 | Karnik et al. |
| 2015/0138454 A1 | 5/2015 | Pugh et al. |
| 2015/0142107 A1 | 5/2015 | Pugh et al. |
| 2015/0145155 A1 | 5/2015 | Pugh et al. |
| 2015/0146162 A1 | 5/2015 | Pugh et al. |
| 2015/0147474 A1 | 5/2015 | Batchvarova et al. |
| 2015/0170788 A1 | 6/2015 | Miller et al. |
| 2015/0174253 A1 | 6/2015 | Sun et al. |
| 2015/0174254 A1 | 6/2015 | Sun et al. |
| 2015/0182473 A1 | 7/2015 | Bosnyak et al. |
| 2015/0185180 A1 | 7/2015 | Ruhl et al. |
| 2015/0196579 A1 | 7/2015 | Ferrante et al. |
| 2015/0202351 A1 | 7/2015 | Kaplan et al. |
| 2015/0212339 A1 | 7/2015 | Pugh et al. |
| 2015/0217219 A1 | 8/2015 | Sinsabaugh et al. |
| 2015/0218210 A1 | 8/2015 | Stetson et al. |
| 2015/0221474 A1 | 8/2015 | Bedworth |
| 2015/0231557 A1 | 8/2015 | Miller et al. |
| 2015/0247178 A1 | 9/2015 | Mountcastle et al. |
| 2015/0258254 A1 | 9/2015 | Simon et al. |
| 2015/0258498 A1 | 9/2015 | Simon et al. |
| 2015/0258502 A1 | 9/2015 | Turowski |
| 2015/0258503 A1 | 9/2015 | Sinton et al. |
| 2015/0258525 A1 | 9/2015 | Westman et al. |
| 2015/0268150 A1 | 9/2015 | Newkirk et al. |
| 2015/0272834 A1 | 10/2015 | Sun et al. |
| 2015/0272896 A1 | 10/2015 | Sun et al. |
| 2015/0273401 A1 | 10/2015 | Miller et al. |
| 2015/0309337 A1 | 10/2015 | Flitsch et al. |
| 2015/0321147 A1 | 11/2015 | Fleming et al. |
| 2015/0323811 A1 | 11/2015 | Flitsch et al. |
| 2015/0336202 A1 | 11/2015 | Bedworth et al. |
| 2015/0342900 A1 | 12/2015 | Putnins |
| 2015/0346382 A1 | 12/2015 | Bliven et al. |
| 2015/0351887 A1 | 12/2015 | Peters |
| 2015/0359742 A1 | 12/2015 | Fassih et al. |
| 2015/0378176 A1 | 12/2015 | Flitsch et al. |
| 2016/0009049 A1 | 1/2016 | Stoltenberg et al. |
| 2016/0038885 A1 | 2/2016 | Hogen-Esch et al. |
| 2016/0043384 A1 | 2/2016 | Zhamu et al. |
| 2016/0058932 A1 | 3/2016 | Stetson et al. |
| 2016/0067390 A1 | 3/2016 | Simon et al. |
| 2016/0074814 A1 | 3/2016 | Park et al. |
| 2016/0074815 A1 | 3/2016 | Sinton et al. |
| 2016/0272499 A1 | 9/2016 | Zurutuza Elorza et al. |
| 2016/0282326 A1 | 9/2016 | Waduge et al. |
| 2016/0284811 A1 | 9/2016 | Yu et al. |
| 2016/0339160 A1 | 11/2016 | Bedworth et al. |
| 2017/0032962 A1 | 2/2017 | Zurutuza Elorza et al. |
| 2017/0037356 A1 | 2/2017 | Simon et al. |
| 2017/0057812 A1 | 3/2017 | Zurutuza Elorza et al. |

FOREIGN PATENT DOCUMENTS

| | | |
|---|---|---|
| CN | 1128501 A | 8/1996 |
| CN | 101108194 A | 1/2008 |
| CN | 101428198 A | 5/2009 |
| CN | 101489653 A | 7/2009 |
| CN | 101996853 A | 3/2011 |
| CN | 102242062 A | 11/2011 |
| CN | 102344132 | 2/2012 |
| CN | 102423272 | 4/2012 |
| CN | 102592720 A | 7/2012 |
| CN | 101996063 B | 8/2012 |
| CN | 102637584 A | 8/2012 |
| CN | 103182249 A | 7/2013 |
| CN | 103603706 A | 2/2014 |
| DE | 19536560 | 3/1997 |
| DE | 10 2005 049 388 A1 | 4/2007 |
| EP | 0 364 628 A1 | 4/1990 |
| EP | 1 034 251 | 1/2004 |
| EP | 1 777 250 A1 | 4/2007 |
| EP | 1 872 812 | 1/2008 |
| EP | 2 060 286 | 5/2009 |
| EP | 2 107 120 A1 | 10/2009 |
| EP | 2 230 511 A1 | 9/2010 |
| EP | 1 603 609 | 5/2011 |
| EP | 2 354 272 | 8/2011 |
| EP | 2 450 096 | 5/2012 |

(56) References Cited

FOREIGN PATENT DOCUMENTS

| | | |
|---|---|---|
| EP | 2 489 520 | 8/2012 |
| EP | 2 511 002 | 10/2012 |
| EP | 2 586 473 | 5/2013 |
| EP | 2 679 540 | 1/2014 |
| EP | 2 937 313 | 10/2015 |
| EP | 3 070 053 | 9/2016 |
| EP | 3 084 398 | 10/2016 |
| EP | 1 538 2430.5 | 3/2017 |
| EP | 3 135 631 | 3/2017 |
| JP | 59-102111 | 7/1984 |
| JP | 10-510471 | 5/1995 |
| JP | 7504120 | 5/1995 |
| JP | 2001-232158 | 8/2001 |
| JP | 2004-179014 | 6/2004 |
| JP | 2005-126966 | 5/2005 |
| JP | 2006-188393 | 7/2006 |
| JP | 2011-168448 A | 9/2011 |
| JP | 2011-241479 | 12/2011 |
| JP | 2004-202480 | 7/2014 |
| JP | 2015-503405 | 2/2015 |
| JP | 2016-175828 | 10/2016 |
| KR | 1020110084110 | 7/2011 |
| KR | 1020120022164 A | 3/2012 |
| KR | 1020140002570 | 1/2014 |
| WO | WO-93/33901 | 3/1993 |
| WO | WO-93/12859 | 8/1993 |
| WO | WO-95/00231 | 1/1995 |
| WO | WO-97/12664 A1 | 4/1997 |
| WO | WO-98/30501 A2 | 7/1998 |
| WO | WO-00/70012 | 11/2000 |
| WO | WO-02/055539 A1 | 7/2002 |
| WO | WO-2004/009840 A1 | 1/2004 |
| WO | WO-2004/082733 | 9/2004 |
| WO | WO-2005/047857 A2 | 5/2005 |
| WO | WO-2007/103411 A2 | 9/2007 |
| WO | WO-2007/140252 A1 | 12/2007 |
| WO | WO-2008/008533 | 1/2008 |
| WO | WO-2009/129984 A1 | 10/2009 |
| WO | WO-2010/006080 | 1/2010 |
| WO | WO-2010/115904 A1 | 10/2010 |
| WO | WO-2011/019686 A1 | 2/2011 |
| WO | WO-2011/046706 A1 | 4/2011 |
| WO | WO-2011/001674 | 6/2011 |
| WO | WO-2011/063458 A1 | 6/2011 |
| WO | WO-2011/075158 | 6/2011 |
| WO | WO-2011/094204 A2 | 8/2011 |
| WO | WO-2011/100458 A2 | 8/2011 |
| WO | WO-2011/138689 A2 | 11/2011 |
| WO | WO-2012/006657 A1 | 1/2012 |
| WO | WO-2012/021801 A2 | 2/2012 |
| WO | WO-2012/027148 A1 | 3/2012 |
| WO | WO-2012/028695 | 3/2012 |
| WO | WO-2012/030368 A1 | 3/2012 |
| WO | WO-2012/138671 A2 | 10/2012 |
| WO | WO-2012/142852 A1 | 10/2012 |
| WO | WO-2013/016445 A1 | 1/2013 |
| WO | WO-2013/048063 A1 | 4/2013 |
| WO | WO-2013/115762 | 8/2013 |
| WO | WO-2013/138137 A1 | 9/2013 |
| WO | WO-2013/138698 A1 | 9/2013 |
| WO | WO-2013/151799 | 10/2013 |
| WO | WO-2013/152179 A1 | 10/2013 |
| WO | WO-2014/084861 A1 | 6/2014 |
| WO | WO-2014/168629 A1 | 10/2014 |
| WO | WO-2015/030698 A1 | 3/2015 |
| WO | WO-2015/138736 A1 | 9/2015 |
| WO | WO-2015/138752 A1 | 9/2015 |
| WO | WO-2015/138771 | 9/2015 |
| WO | WO-2015/197217 | 12/2015 |
| WO | WO-2016/102003 | 6/2016 |

OTHER PUBLICATIONS

Allen et al., "Craters on silicon surfaces created by gas cluster ion impacts," Journal of Applied Physics, 92(7): 3671-8 (Oct. 2002).

AMI Applied Membranes Inc. (undated). FilmTec Nanofiltration Membrane Elements. Retrieved Jun. 1, 2016, from http://www.appliedmembranes.com/filmtec-nanofiltration-membrane-elements.html.

Apel, "Track etching technique in membrane technology," Radiation Measurements 34(1-6): 559-566 (Jun. 2001).

Atmeh et al., "Albumin Aggregates: Hydrodynamic Shape and Physico-Chemical Properties," Jordan Journal of Chemistry, 2(2): 169-182 (2007).

Bae et al., "Roll-to-roll production of 30-inch graphene films for transparent electrodes," Nature Nanotechnology 5: 574-578 (Jun. 20, 2010).

Bai et al., "Graphene nanomesh," Nature Nanotechnology 5: 190-194 (Feb. 14, 2010).

Baker. (2004). "Track-etch Membranes." In Membrane Technology and Applications (2nd ed., pp. 92-94). West Sussex, England: John Wiley & Sons.

Butler et al. "Progress, Challenges, and Opportunities in Two-Dimensional Materials Beyond Graphene", Materials Review 7(4): 2898-2926 (Mar. 6, 2013).

Chen et al., "Mechanically Strong, Electrically Conductive, and Biocompatible Graphene Paper," Adv. Mater., 20(18): 3557-3561 (Sep. 2008) (available online Jul. 2008).

Chhowalla et al., "The chemistry of two-dimensional layered transition metal dichalcogenide nanosheets," Nature Chemistry 5: 263-275 (Mar. 20, 2013).

Childres et al., "Effect of oxygen plasma etching on graphene studied using Raman spectroscopy and electronic transport measurements," New Journal of Physics 13 (Feb. 10, 2011).

Clochard. (undated). Radiografted track-etched polymer membranes for research and application [Scholarly project]. In Laboratoire Des Solides Irradiés. Retrieved Jun. 2, 2016, from http://iramis.cea.fr/radiolyse/5juin2015/Clochard.pdf.

Cohen-Tanugi et al, "Water Desalination across Nanoporous Graphene," ACS Nano Letters 12(7): 3602-3608 (Jun. 5, 2012).

Colton, "Implantable biohybrid artificial organs," Cell Transplantation 4(4): 415-436 (Jul.-Aug. 1995).

Desai et al., "Nanoporous microsystems for islet cell replacement," Advanced Drug Delivery Reviews 56: 1661-1673 (Jul. 23, 2004).

Dong et al., "Growth of large-sized graphene thin-films by liquid precursor-based chemical vapor deposition under atmospheric pressure," Carbon 49(11): 3672-3678 (May 2011).

Fischbein et al., "Electron beam nanosculpting of suspended graphene sheets," Applied Physics Letters 93(113107): 1-3, (Sep. 16, 2008).

Fissell et al., "High-Performance Silicon Nanopore Hemofiltration Membranes," NIH-PA Author Manuscript, PMC, (Jan. 5, 2010), also published in J. Memb. Sci. 326(1): 58-63 (Jan. 5, 2009).

Fuertes et al., "Carbon composite membranes from Matrimid® and Kapton® polyimides for gas separation," Microporous and Mesoporous Materials, 33: 115-125 (Dec. 1999).

Galashev, "Computer study of the removal of Cu from the graphene surface using Ar clusters," Computational Materials Science, 98:123-128 (Feb. 2015) (available online Nov. 2014).

Gimi et al., "A Nanoporous, Transparent Microcontainer for Encapsulated Islet Therapy," J. Diabetes Sci. Tech. 3(2): 1-7 (Mar. 2009).

Hong et al., "Graphene multilayers as gates for multi-week sequential release of proteins from surfaces," NIH-PA Author Manuscript PMC (Jun. 1, 2014), also published in ACS Nano, Jan. 24, 2012; 6(1): 81-88 (first published online Dec. 29, 2011).

Hu et al., "Enabling graphene oxide nanosheets as water separation membranes," Environmental Science & Technology 47(8): 3715-3723 (Mar. 14, 2013).

International Search Report and Written Opinion in PCT/US2015/013599 mailed Jul. 20, 2015.

International Search Report and Written Opinion in PCT/US2015/013805 mailed Apr. 30, 2015.

International Search Report and Written Opinion in PCT/US2015/018114 mailed Jun. 3, 2015.

International Search Report and Written Opinion in PCT/US2015/020246 mailed Jun. 10, 2015.

(56) References Cited

OTHER PUBLICATIONS

International Search Report and Written Opinion in PCT/US2015/020296 mailed Jun. 17, 2015.
International Search Report and Written Opinion in PCT/US2015/028948 mailed Jul. 16, 2015.
International Search Report and Written Opinion in PCT/US2015/029932 mailed Oct. 6, 2015.
International Search Report and Written Opinion in PCT/US2016/027607 mailed Jul. 22, 2016.
International Search Report and Written Opinion in PCT/US2016/027616 mailed Jul. 22, 2016.
International Search Report and Written Opinion in PCT/US2016/027596 mailed Jul. 22, 2016.
International Search Report and Written Opinion in PCT/US2016/027603 mailed Jul. 22, 2016.
International Search Report and Written Opinion in PCT/US2016/027610 mailed Jul. 22, 2016.
International Search Report and Written Opinion in PCT/US2016/027612 mailed Jul. 22, 2016.
International Search Report and Written Opinion in PCT/US2016/027637 mailed Jun. 22, 2016.
International Search Report in PCT/US15/20201 mailed Jun. 10, 2015.
International Search Report in PCT/US2015/048205 mailed Dec. 4, 2015.
Inui et al., "Molecular dynamics simulations of nanopore processing in a graphene sheet by using gas cluster ion beam," Appl. Phys. A, 98: 787-794 (Mar. 2010) (available online Dec. 2009).
Jiang et al., "Porous Graphene as the Ultimate Membrane for Gas Separation," Nano Letters 9(12): 4019-4024 (Sep. 23, 2009).
Joshi et al., "Precise and ultrafast molecular sieving through graphene oxide membranes", Science 343(6172): 752-754 (Feb. 14, 2014).
Kanani et al., "Permeability—Selectivity Analysis for Ultrafiltration: Effect of Pore Geometry," NIH-PA Author Manuscript, PMC, (Mar. 1, 2011), also published in J. Memb. Sci. 349(1-2): 405 (Mar. 1, 2010).
Karan et al., "Ultrafast Viscous Permeation of Organic Solvents Through Diamond-Like Carbon Nanosheets," Science 335: 444-447 (Jan. 27, 2012).
Kim et al., "Fabrication and Characterization of Large Area, Semiconducting Nanoperforated Graphene Materials," Nano Letters 10(4): 1125-1131 (Mar. 1, 2010).
Kim et al., "The structural and electrical evolution of graphene by oxygen plasma-induced disorder," Nanotechnology IOP 20(375703): 1-8 (Aug. 26, 2009).
Koh et al., "Sensitive NMR Sensors Detect Antibodies to Influenza," NIH PA Author Manuscript PMC (Apr. 2009), also published in Angew. Chem. Int'l. Ed. Engl, 47(22): 4119-4121 (May 2008) (available online Apr. 2008).
Koski and Cui, "The New Skinny in Two-Dimensional Nanomaterials", ACS Nano 7(5): 3739-3743 (May 16, 2013).
Kurapati et al., "Graphene oxide based multilayer capsules with unique permeability properties: facile encapsulation of multiple drugs," Chemical Communication 48: 6013-6015 (Apr. 25, 2012).
Lehtinen et al., "Cutting and controlled modification of graphene with ion beams," Nanotechnology, 22: 175306 (8 pages) (Mar. 2011).
Li et al., "3D graphene oxide-polymer hydrogel: near-infrared light-triggered active scaffold for reversible cell capture and on-demand release," Advanced Materials 25: 6737-6743 (Oct. 7, 2013).
Liu et al., "Atomically Thin Molybdenum Disulfide Nanopores with High Sensitivity for DNA Translocation," ACS Nano 8(3): 2504-2511 (Feb. 18, 2014).
Liu et al., "Graphene Oxidation: Thickness-Dependent Etching and Strong Chemical Doping," Nano Letters 8(7): 1965-1970 (Jun. 19, 2008).
Marquardt et al., "Hybrid materials of platinum nanoparticles and thiol-functionalized graphene derivatives," Carbon 66: 285-294 (Jan. 2014; first published online Sep. 12, 2013).
Matteucci et al., "Chapter 1: Transport of gases and Vapors in Glass and Rubbery Polymers," in Materials Science of Membranes for Gas and Vapor Separation (Yampolskii et al eds. 2006) (available online Jun. 2006).
Mishra et al., "Functionalized Graphene Sheets for Arsenic Removal and Desalination of Sea Water," Desalination 282: 39-45 (Nov. 1, 2011).
Morse, "Scalable Synthesis of Semiconducting Nanopatterned Graphene Materials," InterNano Resources for Nanomanufacturing (undated). Retrieved Jun. 2, 2016 from: http://www.internano.org/node/345.
Nair et al., "Unimpeded Permeation of Water Through Helium-Leak-tight Graphene-Based Membranes," Science 335: 442-444 (Jan. 27, 2012).
Nam et al., "Monodispersed PtCo nanoparticles on hexadecyltrimethylammonium bromide treated graphene as an effective oxygen reduction reaction catalyst for proton exchange membrane fuel cells," Carbon 50: 3739-3747 (Aug. 2012) (available online Apr. 2012).
Nandamuri et al., "Chemical vapor deposition of graphene films," Nanotechnology 21(14): 1-4 (Mar. 10, 2010).
Nayini et al., "Synthesis and characterization of functionalized carbon nanotubes with different wetting behaviors and their influence on the wetting properties of carbon nanotubes/polymethylmethacrylate coatings," Progress in Organic Coatings, 77(6): 1007-1014 (Jun. 2014) (available online Mar. 2014).
O'Hern et al. "Selective Molecular Transport through Intrinsic Defects in a Single Layer of CVD Graphene," ACS Nano, 6(11): 10130-10138 (Oct. 2, 2012).
O'Hern et al., "Selective Ionic Transport through Tunable Subnanometer Pores in Single-Layer Graphene Membranes," Nano Letters 14(3): 1234-1241 (Feb. 3, 2014).
O'Hern, "Development of process to transfer large areas of LPCVD graphene from copper foil to a porous support substrate," 1-62 (M.S. Thesis, Massachusetts Institute of Technology) (Sep. 2011).
Paul, "Creating New Types of Carbon-Based Membranes," Science 335: 413-414 (Jan. 27, 2012).
Plant et al., "Size-dependent propagation of Au nanoclusters through few-layer graphene," Nanoscale, 6: 1258-1263 (2014) (available online Oct. 2013).
Popok. "Cluster Ion Implantation in Graphite and Diamond: Radiation Damage and Stopping of Cluster Constituents," Reviews on Advanced Materials Science 38(1): 7-16 (2014).
Russo et al., "Atom-by-atom nucleation and growth of graphene nanopores," PNAS, 109(16): 5953-5957 (Apr. 2012).
Schweicher et al., "Membranes to achieve immunoprotection of transplanted islets," NIH-PA Author Manuscript, PMC, (Nov. 13, 2014), also published in Frontiers in Bioscience (Landmark Ed) 19: 49-76 (Jan. 1, 2014).
Sint et al., "Selective Ion Passage through Functionalized Graphene Nanopores," JACS 130: 16448-16449 (Nov. 14, 2008).
Suk et al., "Water Transport Through Ultrathin Graphene," Journal of Physical Chemistry Letters 1(10): 1590-1594 (Apr. 30, 2010).
Sun et al., "Growth of graphene from solid carbon sources," Nature 468(7323): 549-552 (Nov. 25, 2010; including corrigendum in Nature 471(7336): 124 (Mar. 2011).
Tan et al., "Beta-cell regeneration and differentiation: how close are we to the 'holy grail'?" J. Mol. Encodrinol. 53(3): R119-R129 (Dec. 1, 2014).
Tang et al., "Highly wrinkled cross-linked graphene oxide membranes for biological and charge-storage applications," Small 8(3): 423-431 (Feb. 6, 2012; first published online Dec. 13, 2011).
Vlassiouk et al., "Versatile ultrathin nanoporous silicon nitride membranes," Proc. Natl. Acad. Sci. USA 106(50): 21039-21044 (Dec. 15, 2009).
Wadvalla, "Boosting agriculture through seawater," Nature Middle East (Jul. 2, 2012). Retrieved Jun. 1, 2016 from: natureasia.com/en/nmiddleeast/article/10.1038/nmiddleeast.2012.92?WT.mc_id=FBK NatureMEast.
Wikipedia, "Ion track." Jun. 1, 2016. Retrieved Jun. 1, 2016 from: en.wikipedia.org/wiki/ion_track.
Xu et al., "Graphene-like Two-Dimensional Materials", Chemical Reviews 113: 3766-3798 (Jan. 3, 2013).

(56) References Cited

OTHER PUBLICATIONS

Zabihi et al., "Formation of nanopore in a suspended graphene sheet with argon cluster bombardment: A molecular dynamics simulation study," Nuclear Instruments and Methods in Physics Research B, 343: 48-51 (Jan. 2015) (available online Nov. 2014).
Zan et al., "Graphene Reknits Its Holes," Nano Lett. 12(8): 3936-3940 (Jul. 5, 2012).
Zhao et al. "Two-Dimensional Material Membranes: An Emerging Platform for Controllable Mass Transport Applications," Small 10(22): 4521-4542 (Sep. 10, 2014).
Zhao et al., "Drilling Nanopores in Graphene with Clusters: A Molecular Dynamics Study," J. Phys. Chem. C, 116(21): 11776-1178 (2012) (available online May 2012).
Zhao et al., "Effect of SiO2 substrate on the irradiation-assisted manipulation of supported graphene: a molecular dynamics study," Nanotechnology, 23(28):1-8 (Jul. 2012) (available online Jun. 2012).
CN Office Action in Chinese Application No. 201380013988.9 mailed Aug. 18, 2016 (English translation not readily available).
Cohen-Tanugi, "Nanoporous graphene as a water desalination membrane," (Ph.D. Thesis, Massachusetts Institute of Technology) (Jun. 2015).
US Notice of Allowance in U.S. Appl. No. 14/610,770 mailed Aug. 12, 2016.
US Office Action in U.S. Appl. No. 14/656,190 mailed Aug. 29, 2016.
US Office Action for U.S. Appl. No. 14/656,580 dated Jun. 2, 2016.
US Office Action in U.S. Appl. No. 14/819,273 mailed Jul. 6, 2016.
US Office Action for U.S. Appl. No. 14/856,198 dated Jun. 3, 2016.
Yoon, "Simulations show how to turn graphene's defects into assets," ScienceDaily (Oct. 4, 2016), www.sciencedaily.com/releases/2016/10/161004120428.htm.
Zhang et al. Modern Thin-Film Technology 284-285 (Metallurgical Industry Press, 1st ed. 2009) (English translation not readily available).
U.S. Notice of Allowance for U.S. Appl. No. 14/610,770 dated Apr. 25, 2016.
U.S. Notice of Allowance for U.S. Appl. No. 13/480,569 dated Feb. 27, 2015.
U.S. Notice of Allowance for U.S. Appl. No. 13/480,569 dated May 26, 2012.
U.S. Office Action for U.S. Appl. No. 13/480,569 dated Jul. 30, 2014.
U.S. Office Action for U.S. Appl. No. 14/193,007 dated Dec. 21, 2015.
U.S. Office Action for U.S. Appl. No. 14/193,007 dated Jul. 1, 2016.
U.S. Office Action for U.S. Appl. No. 14/193,007 dated Oct. 21, 2016.
U.S. Restriction Requirement for U.S. Appl. No. 14/193,007 dated Jul. 17, 2015.
Barreiro et al. "Understanding the catalyst-free transformation of amorphous carbon into graphene by current-induced annealing," Scientific Reports, 3 (Article 1115): 1-6 (Jan. 23, 2013).
Botari et al., "Graphene healing mechanisms: A theoretical investigation," Carbon, 99: 302-309 (Apr. 2016) (published online Dec. 12, 2015).
Chen et al., "Defect Scattering in Graphene," Physical Review Letters, 102: 236805-1-236805-4 (Jun. 12, 2009).
Chen et al., "Self-healing of defected graphene," Applied Physics Letters, 102(10): 103107-1-103107-5 (Mar. 13, 2013).
Cheng et al., "Ion Transport in Complex Layered Graphene-Based Membranes with Tuneable Interlayer Spacing," Science Advances 2(2): 1501272 (Feb. 12, 2016).
Crock et al., "Polymer Nanocomposites with Graphene-Based Hierarchical Fillers as Materials for Multifunctional Water Treatment Membranes." Water Research 47(12): 3984-3996 (Aug. 2013; first published online Mar. 29, 2013).
Han et al., "Ultrathin Graphene Nanofiltration Membrane for Water Purification." Advanced Functional Materials 23(29): 3693-3700 (Aug. 1, 2013).

International Search Report and Written Opinion in PCT/US2016/027583 dated Jan. 13, 2017.
International Search Report and Written Opinion in PCT/US2016/027594 dated Jan. 13, 2017.
International Search Report and Written Opinion in PCT/US2016/027628 dated Jan. 9, 2017.
International Search Report and Written Opinion in PCT/US2016/027631 dated Jan. 13, 2017.
International Search Report and Written Opinion in PCT/US2016/027632 dated Jan. 9, 2017.
International Search Report in PCT/US2016/052007 dated Dec. 27, 2016.
Kjeldsen, T., "Yeast secretory expression of insulin precursors," Appl Microbiol Biotechnol, 54: 277-286 (May 2, 2000).
Lin et al., "A Direct and Polymer-Free Method for Transferring Graphene Grown by Chemical Vapor Deposition to Any Substrate," ACSNANO, 8(2): 1784-1791 (Jan. 28, 2014).
Liu et al. "Synthesis of high-quality monolayer and bilayer graphene on copper using chemical vapor deposition," Carbon, 49(13): 4122-4130 (Nov. 2011) (published online May 30, 2011).
O'Hern et al., "Nanofiltration across defect-sealed nanoporous monolayer graphene," Nano Letters, 15(5): 3254-3260 (Apr. 2015).
U.S. Notice of Allowance in U.S. Appl. No. 14/610,770 dated Jan. 23, 2017.
U.S. Notice of Allowance in U.S. Appl. No. 14/856,198 dated Feb. 10, 2017.
U.S. Office Action for U.S. Appl. No. 14/609,325 dated Feb. 16, 2017.
U.S. Office Action for U.S. Appl. No. 14/656,580 dated Feb. 9, 2017.
U.S. Office Action for U.S. Appl. No. 14/843,944 dated Jan. 6, 2017.
U.S. Office Action in U.S. Appl. No. 14/856,471 dated Dec. 1, 2016.
Wang et al., "Graphene Oxide Membranes with Tunable Permeability due to Embedded Carbon Dots." Chemical Communications 50(86): 13089-13092 (Nov. 2014; first published online Sep. 3, 2014).
Written Opinion in PCT/US2016/027590 dated Jan. 6, 2017.
Written Opinion in PCT/US2016/052010 dated Dec. 20, 2016.
Xu et al., "Graphene Oxide-TiO2 Composite Filtration Membranes and their Potential Application for Water Purification." Carbon 62: 465-471 (Oct. 2013; first published online Jun. 21, 2013).
Zhao et al., "A glucose-responsive controlled release of insulin system based on enzyme multilayers-coated mesoporous silica particles," Chem. Commun., 47: 9459-9461 (Jun. 15, 2011).
"Pall Water Processing Disc-Tube Filter Technology", Pall Corporation, [retrieved on Feb. 10, 2015], retrieved from http://www.pall.com/pdfs/Fuels-and-Chemicals/Disc-Tube_Filter_Technoloqy-DT100b.pdF.
Agenor et al., "Renal tubular dysfunction in human visceral leishmaniasis (Kala-azar)," Clinical Nephrology 71(5): 492-500 (May 2009) (available online Mar. 21, 2011).
Albert et al., "Ringer's lactate is compatible with the rapid infusion of AS-3 preserved packed red blood cells," Can. J. Anaesth. 56(5): 352-356 (May 2009) (available online Apr. 2, 2009).
Aluru et al. "Modeling electronics on the nanoscale." Handbook of nanoscience, engineering and technology Goddard W, Brenner D, Lyshevski S, lafrate GJ (2002): 11-1.
Alvarenga, "Carbon nanotube materials for aerospace wiring" Rochester Institute of Technology, 2010.
AMI Applied Membranes Inc., Filmtec Nanofiltration Membrane Elements, <<appliedmembranes.com/nanofiltration_elements.htm>>, accessed Apr. 28, 2015.
Aso et al., "Comparison of serum high-molecular weight (HMVV) adiponectin with total adiponectin concentrations in type 2 diabetic patients with coronary artery using a novel enzyme-linked immunosorbent assay to detect HMW adiponectin," Diabetes 55(7): 1954-1960 (Jul. 2006).
AU Examination Report for Australian Patent Application No. 2013235234, dated Jan. 13, 2017, 4 pages.
Axelsson et al., "Acute hyperglycemia induces rapid, reversible increases in glomerular permeability in nondiabetic rats," AM. J. Physiol. Renal Physiol. 298(6): F1306-F1312 (Jun. 2010) (available online Mar. 17, 2010).

(56) References Cited

OTHER PUBLICATIONS

Bae et al. "Roll-to-roll production of 30-inch graphene films for transparent electrodes." Nature nanotechnology 5.8 (2010): 574-578.
Bains et al., "Novel lectins from rhizomes of two Acorus species with mitogenic activity and inhibitory potential towards murine cancer cell lines," Int'l Immunopharmacol. 5(9): 1470-1478 (Aug. 2005) (available online May 12, 2005).
Baker, "Membrane Technology and Applications", Membrane Technology and Applications; Apr. 14, 2004; pp. 92-94.
Barreiro et al. "Transport properties of graphene in the high-current limit." Physical review letters 103.7 (2009): 076601.
Bazargani et al. (2005), "Low molecular weight heparin improves peritoneal ultrafiltration and blocks complement and coagulation," Peritoneal Dialysis Int'l 25(4): 394-404 (Jul. 2005-Aug. 2005).
Bazargani, "Acute inflammation in peritoneal dialysis: experimental studies in rats. Characterization of regulatory mechanisms," Swedish Dental J. Supp. 171: 1-57, i (2005).
Beppu et al., "Antidiabetic effects of dietary administration of Aloe arborescens Miller components on multiple low-dose streptozotocin-induced diabetes in mice: investigation on hypoglycemic action and systemic absorption dynamics of aloe components," J. Ethnopharmacol. 103(3): 468-77 (Feb. 20, 2006) (available online Jan. 6, 2006).
Bieri et al. "Two-dimensional Polymer Formation on Surfaces: Insight into the Roles of Precursor Mobility and Reactivity" JACS, 2010, vol. 132, pp. 16669-16676.
Bruin et al., "Maturation and function of human embryonic stem cell-derived pancreatic progenitors in macroencapsulation devices following transplant into mice", Diabetologia (2013), vol. 56: 1987-1998 (Jun. 16, 2013).
Chu Ju, et al. "Modern Biotechnology" East China University of Technology Press, (Sep. 2007), vol. 1; pp. 306-307, ISBN 978-7-5628-2116-8.
Clochard, "Track-etched polymer membranes," Ecole Polytechnique,<<Isi. polytechnique.fr/home/research/physics-and-chemistry-of-nano-objects/track-etched-polymer-membranes-97035.kjsp>> Accessed Jul. 30, 2015.
CN Office Action for Application No. 201380014845.X dated Jul. 8, 2016.
CN Office Action for Application No. 201380014845.X dated Sep. 2, 2015.
CN Office Action for Application No. 201380019165.5 dated Aug. 25, 2015.
CN Office Action for Application No. 201380073141.X dated Jun. 8, 2016.
Cn Office Action for Application No. 201480015372.X dated Aug. 2, 2016.
CN Office Action in Chinese Application No. 201380013988.9 dated Oct. 27, 2015 (English translation not readily available).
Corresponding U.S. Appl. No. 13/802,896, filed Mar. 14, 2013.
De Lannoy et al., "Aquatic Biofouling Prevention by Electrically Charged Nanocomposite Polymer Thin Film Membranes", 2013 American Water Work Association membrane Technology Conference; Environmental science & technology 47.6 (2013): 2760-2768.
Deng et al., "Renal protection in chronic kidney disease: hypoxia-inducible factor activation vs. angiotensin II blockade," Am. J. Physiol. Renal Physiol. 299(6): F1365-F1373 (Dec. 2010) (available online Sep. 29, 2010).
EP Office Action for Application No. 13715529.7 dated Jun. 24, 2016.
Fayerman, "Canadian scientists use stem cells to reverse diabetes in mice", The Telegraph-Journal (New Brunswick), 1-2 (Jun. 29, 2012).
Fayerman, "Diabetes reversed in mice; University of B.C. scientists use embryonic stem cells to deal with Type 1 disease", The Vancouver Sun (British Columbia), 1-2 (Jun. 28, 2012).
Fejes et al. "A review of the properties and CVD synthesis of coiled carbon nanotubes." Materials 3.4 (2010): 2618-2642.
Final Rejection for Saudi Arabia Application No. 113340400 dated Jan. 28, 2016.
First Examination Report for Saudi Arabia Application No. 113340401 dated Apr. 28, 2015.
First Examination Report for Saudi Arabia Application No. 113340424 dated May 10, 2015.
First Examination Report for Saudi Arabia Application No. 113340426 dated May 12, 2015.
First Examination Report in Saudi Arabia Application No. 113340400 dated Apr. 13, 2015.
First Office Action for Chinese Application No. 201180049184.5 dated Jul. 30, 2014.
First Office Action for CN Application No. 201380017644.5 dated Sep. 29, 2015.
Freedman et al., "Genetic basis of nondiabetic end-stage renal disease," Semin. Nephrol. 30(2): 101-110 (Mar. 2010).
Garcia-Lopez et al., "Determination of high and low molecular weight molecules of icodextrin in plasma and dialysate, using gel filtration chromatography, in peritoneal dialysis patients," Peritoneal Dialysis Int'l 25(2): 181-191 (Mar. 2005-Apr. 2005).
Gnudi (2008), "Molecular mechanisms of proteinuria in diabetes," Biochem. Soc. Trans. 36(5): 946-949 (Oct. 2008).
Gotloib et al., "Peritoneal dialysis in refractory end-stage congestive heart failure: a challenge facing a no-win situation," Nephrol. Dialysis. Transplant. 20(Supp. 7): vii32-vii36 (Jul. 2005).
Harvey "Carbon as conductor: a pragmatic view." Proceedings of the 61st IWCS Conference, http://www.iwcs.org/archives/56333-iwcs-2012b-1.1584632. vol. 1. 2012.
Hashimoto et al. (Aug. 19, 2004), "Direct evidence for atomic defects in graphene layers", Nature 2004 430 870-3.
Huang et al., "Gene expression profile in circulating mononuclear cells afterexposure to ultrafine carbon particles," Inhalation Toxicol. 22(10): 835-846 (Aug. 2010).
Humplik et al. (Jun. 17, 2011 ), "Nanostructured materials for water desalination", Nanotechnology 22 (2011) 292001.
International Search Report and Written Opinion dated Jan. 5, 2012 for related International Application No. PCT/US11/47800.
International Search Report and Written Opinion dated Mar. 12, 2014 for International Application No. PCT/US2013/074942.
International Search Report and Written Opinion for International Application No. PCT/US2011/047800 dated Jan. 5, 2012.
International Search Report and Written Opinion for PCT Application No. PCT/US2014/023027 dated Jun. 26, 2014.
International Search Report and Written Opinion in International Application No. PCT/US2013/030344 dated Jun. 19, 2013.
International Search Report and Written Opinion in International Application No. PCT/US2013/033035 dated Jun. 28, 2013.
International Search Report and Written Opinion in International Application No. PCT/US2013/033400, dated Jun. 28, 2013.
International Search Report and Written Opinion in International Application No. PCT/US2013/033403 dated Jun. 28, 2013.
International Search Report and Written Opinion in PCT/US2014/041766, dated Sep. 30, 2014.
International Search Report and Written Opinion dated Jun. 5, 2014 in International Application No. PCT/US2014/021677.
International Search Report and Written Opinion dated Jun. 6, 2014 in International Application No. PCT/US2014/023043.
International Search Report and Written Opinion dated Dec. 16, 2014, for International Application No. PCT/US2014/051011.
International Search Report and Written Opinion dated Jun. 19, 2015, in International Application No. PCT/US2015/020287.
Israelachvili, "Intermolecular and Surface Forces," 3rd ed., Chap. 7.1, Sizes of Atoms, Molecules, and Ions, 2011, 1 page.
Japanese Notification of Reasons for Rejection dated Nov. 14, 2016, in related Japanese patent application 2015-503405.
Jiao et al., "Castration differentially alters basal and leucine-stimulated tissue protein synthesis in skeletal muscle and adipose tissue," Am. J. Physiol. Endocrinol. Metab. 297(5): E1222-1232 (Nov. 2009) (available online Sep. 15, 2009).
JP Office Action for Application No. 2015-501867 dated Oct. 11, 2016.
JP Office Action in Japanese Application No. 2015-501729 dated Dec. 9, 2016 (English translation).

(56) References Cited

OTHER PUBLICATIONS

Kang et al., "Effect of eplerenone, enalapril and their combination treatment on diabetic nephropathy in type II diabetic rats," Nephrol. Dialysis Transplant. 24(1): 73-84 (Jan. 2009).
Kar et al., "Effect of glycation of hemoglobin on its interaction with trifluoperazine," Protein J. 25(3): 202-211 (Apr. 2006) (available online Jun. 6, 2006).
Kawamoto et al., "Serum high molecular weight adiponectin is associated with mild renal dysfunction in Japanese adults," J. Atherosclerosis Thrombosis 17(11): 1141-1148 (Nov. 27, 2011).
Khun et al.; From Microporous Regular Frameworks to Mesoporous Materials with Ultrahigh Surface Area: Dynamic reorganization of Porous Polymer Networks; JACS, 2008; vol. 130; pp. 13333-13337.
Kumar et al., "Modulation of alpha-crystallin chaperone activity in diabetic rat lens by curcumin," Molecular Vision 11: 561-568 (Jul. 26, 2005).
Lathuiliere et al., "Encapsulated Cellular Implants for Recombinant Protein Delivery and Therapeutic Modulation of the Immune System," Journal of Applied Physics, Int. J. Mol. Sci., 16: 10578-10600 (May 8, 2015).
Lee, et al. "Measurement of the elastic properties and intrinsic strength of monolayer graphene." science 321.5887 (2008): 385-388.
Inui et al. (Dec. 19, 2009), "Molecular dynamics simulations of nanopore processing in a graphene sheet by using gas cluster ion beam", Appl. Phys. 2010 A 98 787-94.
Lucchese et al. (Jan. 6, 2010), "Quantifying ion-induced defects and Raman relaxation length in graphene", Carbon 2010 48 1592-7.
MacLeod et al; Supramolecular Orderinng in Oligothiophene-Fullerene Monolayers; JACS, 2009, vol. 131, pp. 16844-16850.
Mattevi et al. "A review of chemical vapour deposition of graphene on copper." Journal of Materials Chemistry 21.10 (2011): 3324-3334.
Miao et al. "Chemical vapor deposition of grapheme" INTECH Open Access Publisher, 2011.
Nezlin, "Circulating non-immune IgG complexes in health and disease," Immunol. Lett. 122(2); 141-144 (Feb. 21, 2009) (available online Feb. 2, 2009).
Norata et al., "Plasma adiponectin levels in chronic kidney disease patients: relation with molecular inflammatory profile and metabolic status," Nutr. Metab. Cardiovasc. Dis. 20(1): 56-63 (Jan. 2010) (available online Apr. 9, 2009).
Notice of Acceptance for Australian Application No. 2011293742 dated Jan. 13, 2016.
Notice of Allowance in U.S. Appl. No. 12/868,150 dated Sep. 25, 2012.
Notice of Allowance in U.S. Appl. No. 14/610,770 dated May 5, 2017.
Notice of Allowance in U.S. Appl. No. 14/656,580 dated May 8, 2017.
Notification of Grant for Chinese Application No. 201180049184.5 dated Jun. 6, 2016.
Ogawa et al., "Exosome-like vesicles in Gloydius blomhoffii blomhoffii venom," Toxicon 51(6): 984-993 (May 2008) (available online Feb. 19, 2008).
Oki et al., "Combined acromegaly and subclinical Cushing disease related to high-molecular-weight adrenocorticotropic hormone," J. Neurosurg. 110(2): 369-73 (Feb. 2009).
Osorio et al., "Effect of treatment with losartan on salt sensitivity and SGLT2 expression in hypertensive diabetic rats," Diabetes Res. Clin. Pract. 86(3): e46-e49 (Dec. 2009) (available online Oct. 2, 2009).
Osorio et al., "Effect of phlorizin on SGLT2 expression in the kidney of diabetic rats," J. Nephrol. 23(5): 541-546 (Sep.-Oct. 2010).
Padidela et al., "Elevated basal and post-feed glucagon-like peptide 1 (GLP-1) concentrations in the neonatal period," Eur. J. Endocrinol. 160(1): 53-58 (Jan. 2009) (available online Oct. 24, 2008).

Plant et al. (Oct. 29, 2013), "Size-dependent propagation of AU nanoclusters through few-layer grapheme," The Royal Society of Chemistry 2013, Nanoscale.
Pollard, "Growing Graphene via Chemical Vapor" Department of PhysicS, Pomona College; May 2, 2011.
Rezania et al., "Enrichment of Human Embryonic Stem Cell-Derived NKX6.1-Expressing Pancreatic Progenitor Cells Accelerates the Maturation of Insulin-Secreting Cells In Vivo", Stem Cells Regenerative Medicine, vol. 31: 2432-2442 (Jul. 29, 2013).
Rezania et al., "Maturation of Human Embryonic Stem Cell-Derived Pancreatic Progenitors Into Functional Islets Capable of Treating Pre-existing Diabetes in Mice", Diabetes Journal, vol. 61: 2016-2029 (Aug. 1, 2012).
Ribeiro et al., "Binary Mutual Diffusion Coefficients of Aqueous Solutions of Sucrose, Lactose, Glucose, and Fructose in the Temperature Range from (298.15 to 328.15) K," J. Chem. Eng. Data 51(5): 1836-1840 (Sep. 2006) (available online Jul. 20, 2006).
Rippe et al., "Size and charge selectivity of the glomerular filter in early experimental diabetes in rats," Am. J. Physiol. Renal Physiol. 293(5): F1533-F1538 (Nov. 2007)(available online Aug. 15, 2007).
Search and Exam Report for UAE Application No. P186/13 dated Oct. 4, 2016.
Second Examination Report for Saudi Arabia Application No. 113340400 dated Aug. 11, 2015.
Second Office Action for Chinese Application No. 201180049185 dated Jun. 15, 2015.
Second Office Action for CN Application No. 201380017644.5 dated May 26, 2016.
Sethna et al., "Serum adiponectin levels and ambulatory blood pressure monitoring in pediatric renal transplant recipients," Transplantation 88(8): 1030-1037 (Oct 27, 2009).
Sullivan et al., "Microarray analysis reveals novel gene expression changes associated with erectile dysfunction in diabetic rats," Physiol. Genom. 23(2): 192-205 (Oct. 17, 2005) (available online Aug. 23, 2005).
Swett et al, "Imagining and Sculpting Graphene on the atomic scale" Oak Ridge National Laboratory's (ORNL) Center for Nanophase Materials Sciences (CNMS) Biannual Review. 1 page.
Swett et al, "Supersonic Nanoparticle Interaction with Suspended CVD Graphene", Microsc. Microanal. 22 (Suppl 3): 1670-1671 (Jul. 25, 2016).
Takata et al. (2008),"Hyperresistinemia is associated with coexistence of hypertension and type 2 diabetes," Hypertension 51. 2 (Feb. 2008): 534-9.
Tamborlane et al. (2008),"Continuous Glucose Monitoring and Intensive Treatment of Type 1 Diabetes"; N Engl J Med 359;14: 1464-1476.
Tanugi et al., "Nanoporous Graphene Could Outperform Best Commercial Water Desalination Techniques," ; ACS 2012; Jun. 25, 2012; Weftec 2012; Sep. 29-Oct. 3.
Third Office Action for Chinese Application No. 201180049184.5 dated Mar. 4, 2016.
Third Office Action for CN Application No. 201380017644.5 dated Feb. 7, 2017.
Totani et al. (2008),"Gluten binds cytotoxic compounds generated in heated frying oil ," Journal of oleo science 57. 12 (2008): 683-90.
Tsukamoto et al. (2008),"Purification, characterization and biological activities of a garlic oliqosaccharide," Journal of UOEH 30. 2 (Jun. 1, 2008): 147-57.
UMEA Universitet "Graphene nanoscrolls are formed by decoration of magnetic nanoparticles." ScienceDaily. Aug. 15, 2013. https://www.sciencedaily.com/releases/2013/08/130815084402.htm.
U.S. Notice of Allowability for U.S. Appl. No. 13/803,958 dated Aug. 29, 2016.
U.S. Notice of Allowability for U.S. Appl. No. 13/803,958 dated Sep. 12, 2016.
U.S. Notice of Allowance for U.S. Appl. No. 12/868,150 dated Sep. 25, 2012.
U.S. Notice of Allowance for U.S. Appl. No. 13/548,539 dated Aug. 18, 2015.
U.S. Notice of Allowance for U.S. Appl. No. 13/548,539 dated Jul. 23, 2015.

(56) References Cited

OTHER PUBLICATIONS

U.S. Notice of Allowance for U.S. Appl. No. 13/719,579 dated May 20, 2016.
U.S. Notice of Allowance for U.S. Appl. No. 13/795,276 dated Oct. 7, 2016.
U.S. Notice of Allowance for U.S. Appl. No. 13/802,896 dated Apr. 1, 2015.
U.S. Notice of Allowance for U.S. Appl. No. 13/803,958 dated Aug. 29, 2016.
U.S. Notice of Allowance for U.S. Appl. No. 13/803,958 dated Jun. 2, 2016.
U.S. Notice of Allowance for U.S. Appl. No. 13/803,958 dated Sep. 12, 2016.
U.S. Notice of Allowance for U.S. Appl. No. 13/804,085 dated Jan. 15, 2015.
U.S. Notice of Allowance for U.S. Appl. No. 13/804,085 dated Mar. 12, 2015.
U.S. Notice of Allowance for U.S. Appl. No. 13/923,503 dated Oct. 14, 2016.
U.S. Notice of Allowance for U.S. Appl. No. 13/923,503 dated Oct. 5, 2016.
U.S. Notice of Allowance for U.S. Appl. No. 14/200,195 dated Jul. 5, 2016.
U.S. Notice of Allowance for U.S. Appl. No. 14/200,530 dated Aug. 1, 2016.
U.S. Notice of Allowance for U.S. Appl. No. 14/203,655 dated Dec. 9, 2016.
U.S. Notice of Allowance on U.S. Appl. No. 13/795,276 dated Jan. 19, 2017.
U.S. Office Action for U.S. Appl. No. 13/548,539 dated Feb. 6, 2015.
U.S. Office Action for U.S. Appl. No. 13/719,579 dated Jul. 8, 2015.
U.S. Office Action for U.S. Appl. No. 13/719,579 dated May 4, 2016.
U.S. Office Action for U.S. Appl. No. 13/795,276 dated Apr. 22, 2016.
U.S. Office Action for U.S. Appl. No. 13/795,276 dated Oct. 6, 2015.
U.S. Office Action for U.S. Appl. No. 13/802,896 dated Sep. 24, 2014.
U.S. Office Action for U.S. Appl. No. 13/803,958 dated Aug. 11, 2014.
U.S. Office Action for U.S. Appl. No. 13/803,958 dated May 28, 2015.
U.S. Office Action for U.S. Appl. No. 13/803,958 dated Nov. 18, 2015.
U.S. Office Action for U.S. Appl. No. 13/923,503 dated Mar. 22, 2016.
U.S. Office Action for U.S. Appl. No. 14/031,300 dated Jan. 20, 2016.
U.S. Office Action for U.S. Appl. No. 14/031,300 dated Jul. 7, 2015.
U.S. Office Action for U.S. Appl. No. 14/200,195 dated Mar. 21, 2016.
U.S. Office Action for U.S. Appl. No. 14/200,195 dated Nov. 4, 2015.
U.S. Office Action for U.S. Appl. No. 14/200,530 dated Feb. 29, 2016.
U.S. Office Action for U.S. Appl. No. 14/203,655 dated Aug. 10, 2016.
U.S. Office Action for U.S. Appl. No. 14/858,741 dated Dec. 1, 2016.
U.S. Office Action for U.S. Appl. No. 15/289,944 dated Feb. 9, 2017.
U.S. Office Action for U.S. Appl. No. 15/336,545 dated Dec. 19, 2016.
U.S. Office Action in U.S. Appl. No. 14/193,007 dated Apr. 24, 2017.
U.S. Office Action on U.S. Appl. No. 14/656,617 dated Apr. 3, 2017.
U.S. Office Action on U.S. Appl. No. 15/332,982 dated Jan. 30, 2017.
U.S. Supplemental Notice of Allowance for U.S. Appl. No. 13/795,276 dated Nov. 29, 2016.
Vallon,"Micropuncturing the nephron," Pflugers Archiv: European journal of physiology 458. 1 (May 2009): 189-201.
Verdonck, P., "Plasma Etching", in Oficina de Microfabricao: Projeto e Construcao de CI's MOS, Swart, J.W., Ed., Campinas (Sao Paulo, Brazil): UNICAMP, 2006, ch. 10, p. 9.
Vlassiouk et al. "Large scale atmospheric pressure chemical vapor deposition of graphene." Carbon 54 (2013): 58-67.
Vriens et al. "Methodological considerations in quantification of oncological FDG PET studies." European journal of nuclear medicine and molecular imaging 37.7 (2010): 1408-1425.
Wang et al., "Direct Observation of a Long-Lived Single-Atom Catalyst Chiseling Atomic Structures in Graphene," Nano Lett., 2014, pp. A-F.
Wang et al., "Porous Nanocarbons: Molecular Filtration and Electronics," Advances in Graphene Science, Edited by Mahmood Aliofkhazraei, (2013) ISBN 978-953-51/1182-5, Publisher: InTech; Chapter 6, pp. 119-160.
Wang et al.,"What is the role of the second "structural " NADP+-binding site in human glucose 6-phosphate dehydrogenase?," Protein science a publication of the Protein Society 17. 8 (Aug. 2008): 1403-11.
Wei et al., "Synthesis of N-doped graphene by chemical vapor deposition and its electrical properties", Nano Lett. 2009 9 1752-58.
Xiaogan Liang et al., Formation of Bandgap and Subbands in Graphene Nanomeshes with Sub-10nm Ribbon Width Fabricated via Nanoimprint Lithography., Nano Letters, Jun. 11, 2010, pp. 2454-2460.
Xie et al., "Fractionation and characterization of biologically-active polysaccharides from Artemisia tripartite," Phytochemistry 69. 6 (Apr. 2008): 1359-71.
Yagil et al. (2005),"Nonproteinuric diabetes-associated nephropathy in the Cohen rat model of type 2 diabetes," Diabetes 54. 5 (May 2005): 1487-96.
Zan et al. (Mar. 8, 2012), "Interaction of Metals with Suspended Graphene Observed by Transmission Electron Microscopy", J. Phys. Chem. Lett. 2012, 3, 953-958.
Zhang et al. (2007),"Isolation and activity of an alpha-amylase inhibitor from white kidney beans," Yao xue xue bao =Acta pharmaceutica Sinica 42. 12 (Dec. 2007): 1282-7.
Zhang et al. (Mar. 27, 2003), "Effect of chemical oxidation on the structure of single-walled carbon nanotubes", J. Phys. Chem., 2003, B 107 3712-8.
Zhang et al. (May 6, 2010), "Production of Graphene Sheets by Direct Dispersion with Aromatic Healing Agents", Small 2010, x, No. x, 1-8.
Zhang et al.; Method for anisotropic etching of graphite or graphene; Institute of Physics, Chinese Academy of Sciences; PEOP. Rep. China; Mar. 30, 2011.
Zhu et al. (2011 ),"Carbon Nanotubes in Biomedicine and Biosensing," in Carbon Nanotubes—Growth and Applications, Ch. 6, pp. 135-162.
Ziegelmeier et al. (2008),"Adipokines influencing metabolic and cardiovascular disease are differentially regulated in maintenance hemodialysis," Metabolism: clinical and experimental 57. 10 (Oct. 2008): 1414-21.
Zirk et al. (2007),"A refractometry-based glucose analysis of body fluids," Medical engineering & physics 29. 4 (May 2007): 449-58.
Zyga "Nanoporous Graphene Could Outperform Best Commercial Water Desalination Techniques," Phys.org. http://www.phys.org/pdf259579929.pdf. [Last Accessed Dec. 3, 2014].
CN Office Action for Chinese Application No. 201380014845.X dated Dec. 23, 2016.
CN Office Action for Chinese Application No. 201380073141.X dated Mar. 21, 2017.
Edwards, "Large Sheets of Graphene Film Produced for Transparent Electrodes (w/ Video)"; (2010) PhysOrg.com.
Franzen, C. "MIT Setting Up Industrial-Scale Graphene Printing Press" Sep. 23, 2011.
Georgakilas et al., "Functionalization of Graphene: Covalent and Non-Covalent Approaches, Derivatives and Applications," Chem. Rev., (2012) 112(11), pp. 6156-6214.

(56) References Cited

OTHER PUBLICATIONS

He, et al. "The attachment of Fe 3 O 4 nanoparticles to graphene oxide by covalent bonding." Carbon 48.11 (2010): 3139-3144.
Hone et al. "Graphene has record-breaking strength" Physicsworld.com, Jul. 17, 2008.
Krupka et al., "Measurements of the Sheet Resistance and Conductivity of Thin Epitaxial Graphene and SiC Films" Applied Physics Letters 96, 082101-I; Feb. 23, 2010.
U.S. Office Action in U.S. Appl. No. 14/656,335 dated Apr. 25, 2017.
Van Der Zande et al. "Large-scale arrays of single-layer graphene resonators." Nano letters 10.12 (2010): 4869-4873.
Xie, et al. "Controlled fabrication of high-quality carbon nanoscrolls from monolayer graphene." Nano letters 9.7 (2009): 2565-2570.
Zhao, et al. "Efficient preparation of large-area graphene oxide sheets for transparent conductive films." ACS nano 4.9 (2010): 5245-5252.
Zhou, K., et al., "One-pot preparation of graphene/Fe3O4 composites by a solvothermal reaction," New J. Chem., (2010): 34, 2950.
Database WPI, Week 201238, Thomson Scientific, London, GB; AN 2012-D49442.
JP Office Action in Japanese Application No. 2015-503406 dated Dec. 6, 2016 (with English translation).
MIT/MTL Center for Graphene Devices and 2D Systems, retrieved from: http://www-mtl.mit.edu/wpmu/graphene/ [retrieved from archive of Aug. 21, 2014].
MIT/MTL Center for Graphene Devices and 2D Systems, retrieved from: http://www-mtl.mit.edu/wpmu/graphene/ [retrieved from archive of Mar. 4, 2015].
U.S. Office Action in U.S. Appl. No. 14/193,007 dated Mar. 23, 2017.
U.S. Office Action in U.S. Appl. No. 15/099,464 dated Mar. 10, 2017.
Kang et al., "Efficient Transfer of Large-Area Graphene Films onto Rigid Substrates by Hot Pressing," American Chemical Society Nano, 6(6): 5360-5365(May 28, 2012).
Myunwoong Kim, et al, Fabrication and characterization of Large-Area, Semiconducting Nanoperforated Graphene Materials, American Chemical Society vol. 10, 1125-1131 (2010).
TW Office Action in Taiwanese Application No. 102146079 dated Apr. 14, 2017 (English translation).
TW Search Report in Taiwanese Application No. 102146079 dated Apr. 14, 2017.
U.S. Notice of Allowance in U.S. Appl. No. 15/099,464 dated Jun. 16, 2017.
U.S. Office Action for U.S. Appl. No. 14/656,190 dated May 18, 2017.
U.S. Office Action for U.S. Appl. No. 14/686,452 dated Jun. 9, 2017.
U.S. Office Action for U.S. Appl. No. 14/856,471 dated May 31, 2017.
U.S. Office Action for U.S. Appl. No. 15/453,441 dated Jun. 5, 2017.
AU Examination Report for Australian Patent Application No. 2013363283, dated Jun. 20, 2017, 4 pages.
Daniel et al. "Implantable Diagnostic Device for Cancer Monitoring." Biosens Bioelectricon. 24(11): 3252-3257 (Jul. 15, 2009).
International Search Report and Written Opinion dated Jul. 5, 2017 from related PCT application PCT/US2017/024147.
JP Office Action in Japanese Application No. 2015-501729 dated Jun. 20, 2017 (English translation).
Li, R.H. "Materials for immunoisolated cell transplantation". Adv. Drug Deliv. Rev. 33, 87-109 (1998).
Nafea, et al. "Immunoisolating semi-permeable membranes for cell encapsulation: focus on hydrogels." J Control Release. 154(2): 110-122 (Sep. 5, 2011).
Ohgawara et al. "Assessment of pore size of semipermeable membrane for immunoisolation on xenoimplantation of pancreatic B cells using a diffusion chamber." Transplant Proc. (6): 3319-3320.
Rafael et al. "Cell Transplantation and Immunoisolation: Studies on a macroencapsulation device." From the Departments of Transplantation Pathology: Stockholm, Sweden (1999).
Sanchez, et al. "Biological Interactions of Graphene-Family Nanomaterials—An Interdisciplinary Review." Chem Res Toxicol. 25(1): 15-34 (Jan. 13, 2012).
U.S. Office Action for U.S. Appl. No. 14/656,657 dated Jul. 7, 2017.
U.S. Office Action for U.S. Appl. No. 14/843,944 dated Jun. 23, 2017.
U.S. Office Action for U.S. Appl. No. 15/099,193 dated Jul. 19, 2017.
U.S. Office Action for U.S. Appl. No. 15/289,944 dated Jul. 13, 2017.

\* cited by examiner

METHODS FOR PERFORATING MULTI-LAYER GRAPHENE THROUGH ION BOMBARDMENT

CROSS-REFERENCE TO RELATED APPLICATIONS

This application claims the benefit of priority under 35 U.S.C. §119 from U.S. Provisional Patent Application No. 62/039,856, filed Aug. 20, 2014, and is a continuation-in-part of U.S. patent application Ser. No. 14/610,770, filed Jan. 30, 2015, which claims the benefit of priority under 35 U.S.C. §119 to U.S. Provisional Patent Application No. 61/934,530, filed Jan. 31, 2014, each of which are hereby incorporated by reference in its entirety.

STATEMENT REGARDING FEDERALLY SPONSORED RESEARCH OR DEVELOPMENT

Not applicable.

FIELD

The present disclosure generally relates to graphene based materials and other two-dimensional materials, and, more specifically, to methods for producing pores in multi-layer stacked graphene sheets and other two-dimensional materials.

BACKGROUND

Graphene has garnered widespread interest for use in a number of applications due to its favorable mechanical and electronic properties. The electrical conductivity of graphene can be influenced by the amount and type of chemical functionalization on the graphene and the quantity of defects in the graphene basal plane. Although pristine graphene typically displays the highest electrical conductivity values, it can sometimes be desirable to tune the electrical conductivity and adjust the band gap. Tailoring of the band gap can be accomplished, for example, by introducing a plurality of defects (i.e., holes or perforations) within the graphene basal plane or increasing the number of such defects. The band gap can be influenced by both the size and number of holes present. Applications that have been proposed for graphene include optical devices, mechanical structures, and electronic devices. In addition to the foregoing applications, there has been some interest in perforated graphene for filtration applications, particularly single-layer perforated graphene.

Current techniques used to perforate CVD graphene include oxidation processes (e.g., UV ozone, plasma oxidation, and high temperatures), ion beams, template cutting (e.g., "cookie cutter" mechanical perforation), and direct synthesis using specialized growth substrates. However, these techniques are not presently suitable for large scale production of perforated graphene in commercially realistic quantities. Control of the pore size distribution and the number of pores per unit area can also be an issue. Production of sub-nanometer pores (<1 nm in pore size) can be particularly difficult to achieve.

Other two-dimensional materials having a thickness of a few nanometers or less and an extended planar lattice are also of interest for various applications. In an embodiment, a two dimensional material has a thickness of 0.3 to 1.2 nm. In other embodiment, a two dimensional material has a thickness of 0.3 to 3 nm. For example, molybdenum sulfide is a representative chalcogenide having a two-dimensional molecular structure, and other various chalcogenides can constitute the two-dimensional material in the present disclosure.

In view of the foregoing, techniques that allow pores to be produced in graphene with a desired pore density and pore size would be of considerable benefit in the art. The present disclosure satisfies this need and provides related advantages as well.

SUMMARY

The present disclosure describes methods for introducing pores into the basal plane of a plurality of graphene sheets stacked upon one another. In embodiments, the methods involve exposing about 5-20 layers of stacked graphene sheets (i.e., multi-layer graphene) to a particle beam having an ion energy of about 1500 eV or greater (per ion) to produce damage tracks in the basal planes of the stacked graphene sheets. In further embodiments, the ion energy greater than about 1500 eV but less than about 10000 eV or greater than 1.5 keV and less than 100 keV. The present disclosure further describes perforation methods including the step of exposing a sheet of graphene-based material to an ion beam, the graphene-based material comprising multi-layer graphene having from 5 to 20 layers of graphene.

In embodiments, the damage tracks extend through the multi-layer graphene. Thereafter, the damaged graphene sheets are exposed to a chemical etchant, such as an oxidant, that selectively attacks defects (e.g. triple carbon-carbon bonds) in the damage tracks to remove graphene-based carbon atoms within the damage tracks. The damage tracks are tunable in size based upon the ion and energy used. In an embodiment, the oxidant is selected from the group consisting of ozone, an aqueous solution of potassium permanganate, an aqueous solution of potassium permanganate and sulfuric acid, an aqueous solution of potassium permanganate and potassium hydroxide or a solution of hydrogen peroxide and sulfuric acid In embodiments, the ion bombardment takes place while the graphene-based material is disposed on a substrate. In some embodiments, the bombardment and etching can take place while the graphene is disposed on a substrate. In embodiments, the substrate is a metal growth substrate or other substrate.

Multi-layer graphene sheets and graphene-based materials comprising multi-layer graphene having a plurality of pores penetrating through the stacked sheets are also described in the present disclosure. Such perforated multi-layer graphene sheets will also be referred to herein as "perforated graphene" "perforated graphene-based materials" or "perforated two dimensional materials," In some embodiments, the perforations can be about 50 nm in size or less, 20 nm in size or less, 10 nm in size or less, or less than about 5 nm in size, particularly in a size range from about 0.2 nm to about 50 nm, 0.2 nm to about 20 nm, 0.2 nm to about 10 nm or from about 0.2 nm to about 5 nm. In embodiments, about 5 to about 20 stacked graphene sheets are present in the multi-layer graphene. In an embodiment, after perforation of the sheet the structure of the graphene based material in unperforated regions of the sheet is similar to that of the starting unperforated graphene based material.

In some embodiments, perforated graphene and perforated graphene-based materials comprising multilayered graphene produced by the techniques described herein can be used in filtration applications. The size or size range of perforations is adapted to the intended application. Some of the pore size ranges describe herein are suitable for reverse osmosis filtration and molecular filtration applications.

The foregoing has outlined rather broadly the features of the present disclosure in order that the detailed description that follows can be better understood. Additional features and advantages of the disclosure will be described hereinafter. These and other advantages and features will become more apparent from the following description.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
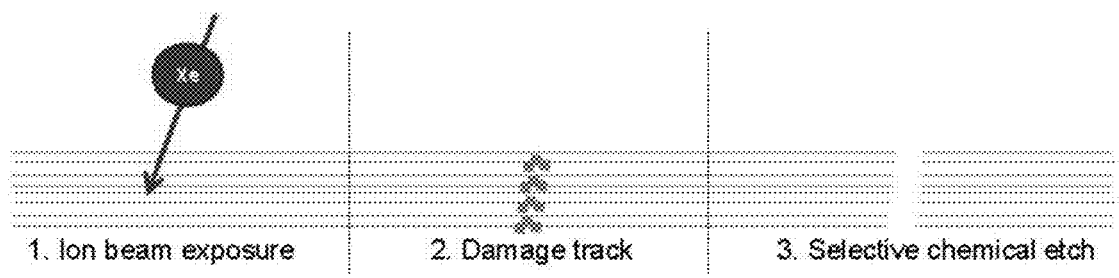
FIG. 1 shows an illustrative schematic demonstrating how pores can be selectively introduced into a plurality of stacked graphene sheets according to the techniques of the present disclosure.

Graphene represents a form of carbon in which the carbon atoms reside within a single atomically thin sheet or a few layered sheets (e.g., about 20 or less) of fused six-membered rings forming an extended $sp^2$-hybridized carbon planar lattice. Graphene-based materials include, but are not limited to, single layer graphene, multilayer graphene or interconnected single or multilayer graphene domains and combinations thereof. In embodiments, multilayer graphene includes 2 to 20 layers, 2 to 10 layers or 2 to 5 layers. In an embodiment, layers of multilayered graphene are stacked, but are less ordered in the z direction (perpendicular to the basal plane) than a thin graphite crystal.

In an embodiment, graphene-based materials also include materials which have been formed by stacking single or multilayer graphene sheets. For example, a sheet of single layer graphene (SLG) is layered via float-down on top of a substrate. Another sheet of the SLG is then floated it down on the already prepared SLG-substrate stack. This would now be 2 layers of "as synthesized" SLG on top of the substrate. This could be extended to few layer graphene (FLG) or a mixture of SLG and FLG; and could be achieved through transfer methods known to the art.

In an embodiment, a sheet of graphene-based material is a sheet of single or multilayer graphene or a sheet comprising a plurality of interconnected single or multilayer graphene domains. In embodiments, the multilayer graphene domains have 2 to 5 layers or 2 to 10 layers. As used herein, a "domain" refers to a region of a material where atoms are uniformly ordered into a crystal lattice. A domain is uniform within its boundaries, but different from a neighboring region. For example, a single crystalline material has a single domain of ordered atoms. In an embodiment, at least some of the graphene domains are nanocrystals, having domain size from 1 to 100 nm or 10-100 nm. In an embodiment, at least some of the graphene domains have a domain size greater than 100 nm to 1 micron, or from 200 nm to 800 nm, or from 300 nm to 500 nm. In an embodiment, a domain of multilayer graphene may overlap a neighboring domain. "Grain boundaries" formed by crystallographic defects at edges of each domain differentiate between neighboring crystal lattices. In some embodiments, a first crystal lattice may be rotated relative to a second crystal lattice, by rotation about an axis perpendicular to the plane of a sheet, such that the two lattices differ in "crystal lattice orientation".

In an embodiment, the sheet of graphene-based material is a sheet of multilayer graphene or a combination of single and multilayer graphene. In another embodiment, the sheet of graphene-based material is a sheet comprising a plurality of interconnected multilayer or single and multilayer graphene domains. In an embodiment, the interconnected domains are covalently bonded together to form the sheet. When the domains in a sheet differ in crystal lattice orientation, the sheet is polycrystalline.

In embodiments, the thickness of the sheet of graphene-based material is from 0.3 to 10 nm, 0.34 to 10 nm, from 0.34 to 5 nm, or from 0.34 to 3 nm. In an embodiment, the thickness includes both single layer graphene and the non-graphenic carbon.

In an embodiment, a sheet of graphene-based material comprises intrinsic defects. Intrinsic defects are those resulting from preparation of the graphene-based material in contrast to perforations which are selectively introduced into a sheet of graphene-based material or a sheet of graphene. Such intrinsic defects include, but are not limited to, lattice anomalies, pores, tears, cracks or wrinkles. Lattice anomalies can include, but are not limited to, carbon rings with other than 6 members (e.g. 5, 7 or 9 membered rings), vacancies, interstitial defects (including incorporation of non-carbon atoms in the lattice), and grain boundaries. As used herein, perforations do not include openings in the graphene lattice due to intrinsic defects or grain boundaries.

In embodiments, graphene is the dominant material in a graphene-based material. For example, a graphene-based material comprises at least 20% graphene, 30% graphene, or at least 40% graphene, or at least 50% graphene, or at least 60% graphene, or at least 70% graphene, or at least 80% graphene, or at least 90% graphene, or at least 95% graphene. In embodiments, a graphene-based material comprises a range of graphene selected from 30% to 95%, or from 40% to 80% from 50% to 70%, from 60% to 95% or from 75% to 100%. In an embodiment, the amount of graphene in the graphene-based material is measured as an atomic percentage.

In an embodiment, a sheet of graphene-based material further comprises non-graphenic carbon-based material located on a surface of the sheet of graphene-based material. In an embodiment, the sheet is defined by two base surfaces (e.g. top and bottom faces of the sheet) and side faces. In a further embodiment, the "bottom" face of the sheet is that face which contacted the substrate during growth of the sheet and the "free" face of the sheet opposite the "bottom" face. In an embodiment, non-graphenic carbon-based material is located on a base surface of the sheet (e.g. the substrate side of the sheet and/or the free surface of the sheet). In a further embodiment, the sheet of graphene-based material includes a small amount of one or more other materials on the surface, such as, but not limited to, one or more dust particles or similar contaminants.

In an embodiment, the amount of non-graphenic carbon-based material is less than the amount of graphene. In embodiments, the surface coverage of the sheet of non-graphenic carbon-based material is greater than zero and less than 80%, from 5% to 80%, from 10% to 80%, from 5% to 50% or from 10% to 50%. This surface coverage may be measured with transmission electron microscopy, which gives a projection. In embodiments, the amount of graphene in the graphene-based material is from 60% to 95% or from 75% to 100%.

In an embodiment, the non-graphenic carbon-based material does not possess long range order and may be classified as amorphous. In embodiments, the non-graphenic carbon-based material further comprises elements other than carbon and/or hydrocarbons. In an embodiment, non-carbon elements which may be incorporated in the non-graphenic carbon include hydrogen, oxygen, silicon, copper and iron. In further embodiment, the non-graphenic carbon-based material comprises hydrocarbons. In embodiments, carbon is the dominant material in non-graphenic carbon-based material. For example, a non-graphenic carbon-based material comprises at least 30% carbon, or at least 40% carbon, or at least 50% carbon, or at least 60% carbon, or at least 70% carbon, or at least 80% carbon, or at least 90% carbon, or at least 95% carbon. In embodiments, a non-graphenic carbon-based material comprises a range of carbon selected from 30% to 95%, or from 40% to 80%, or from 50% to 70%. In an embodiment, the amount of carbon in the non-graphenic carbon-based material is measured as an atomic percentage.

In further embodiments, the sheet of graphene based material is larger than a flake which would be obtained by exfoliation. For example, the sheet has a lateral dimension greater than about 1 micrometer. As used herein, a lateral dimension is perpendicular to the thickness of the sheet.

Nanomaterials in which pores are intentionally created will be referred to herein as "perforated graphene", "perforated graphene-based materials" or "perforated two-dimensional materials." The size distribution of holes may be narrow, e.g., limited to 0.1 to 0.5 coefficient of variation. In an embodiment, the characteristic dimension of the holes is selected for the application. For circular holes, the characteristic dimension is the diameter of the hole. In embodiments relevant to non-circular pores, the characteristic dimension can be taken as the largest distance spanning the hole, the smallest distance spanning the hole, the average of the largest and smallest distance spanning the hole, or an equivalent diameter based on the in-plane area of the pore. As used herein, perforated graphene-based materials include materials in which non-carbon atoms have been incorporated at the edges of the pores. In embodiments, the pore is asymmetric with the pore size varying along the length of the hole (e.g. pore size wider at the free surface of the graphene-based material than at the substrate surface or vice versa. In an embodiment, the pore size may be measured at one surface of the sheet of graphene based material.

Quantitative image analysis of pore features may include measurement of the number, area, size and/or perimeter of pore features. In an embodiment, the equivalent diameter of each pore is calculated from the equation $A=\pi d^2/4$. When the pore area is plotted as a function of equivalent pore diameter, a pore size distribution is obtained. The coefficient of variation of the pore size is calculated herein as the ratio of the standard deviation of the pore size to the mean of the pore size.

In an embodiment, the ratio of the area of the perforations to the ratio of the area of the sheet is used to characterize the sheet. The area of the perforations may be measured using quantitative image analysis. The area of the sheet may be taken as the planar area spanned by the sheet if it is desired to exclude the additional sheet surface area due to wrinkles or other non-planar features of the sheet. In a further embodiment, characterization may be based on the ratio of the area of the perforations to the sheet area excluding features such as surface debris. In embodiments, the perforated area comprises 0.1% or greater, 1% or greater or 5% or greater of the sheet area, less than 10% of the sheet area, less than 15% of the sheet area, from 0.1% to 15% of the sheet area, from 1% to 15% of the sheet area, from 5% to 15% of the sheet area or from 1% to 10% of the sheet area. In a further embodiment, the perforations are located over greater than 10% or greater than 15% of said area of said sheet of graphene-based material.

The present disclosure is directed, in part, to multi-layer graphene sheets and sheets of graphene-based material having about 5 to about 20 graphene sheets stacked upon one another and a plurality of pores penetrating through the stacked graphene sheets. The present disclosure is also directed, in part, to methods for perforating multi-layer graphene sheets and sheets of graphene-based material comprising multilayer graphene and defining pores therein that extend through the multiple graphene sheets.

Perforated graphene (i.e., graphene having a plurality of pores defined therein) has a number of possible applications including, for example, use as a molecular filter, use as a defined band gap material, and use as an electrically conductive filler material with tunable electrical properties within polymer composites. Although a number of potential uses for perforated graphene exist, there are few reliable techniques to reproducibly introduce a plurality of pores in graphene, where the pores are presented in a desired pore density and pore size. Generation of sub-nanometer pores can be particularly problematic.

In the embodiments described herein, pore generation can desirably be controlled through modulation of the energy and nature of ions used for bombarding multi-layer graphene. In particular, the methods described herein involve exposing a multi-layer graphene having about 5-20 stacked graphene sheets to a particle beam (ion current) having an ion energy of 1500 eV or greater. In some embodiments, the ions can have an energy greater than about 1500 eV but less than about 10000 eV or greater than 1.5 keV and less than 100 keV. In embodiments, the ion source provides an ion dose to the multilayered material ranging from $1\times10^{10}$ ions/cm$^2$ to $1\times10^{17}$ ions/cm$^2$, from $1\times10^{11}$ ions/cm$^2$ to $1\times10^{15}$ ions/cm$^2$ or from $1\times10^{13}$ ions/cm$^2$ to $1\times10^{19}$ ions/cm$^2$. In an embodiment, the ion dose is adjusted based on the ion, with lighter ions (lower mass ions) being provided at a higher dosage. In embodiments, the ion flux or beam current density ranges from 0.1 nA/mm$^2$ to 100 nA/mm$^2$, from 0.1 nA/mm$^2$ to 10 nA/mm$^2$, 0.1 nA/mm$^2$ to 1 nA/mm$^2$, from 1 nA/mm$^2$ to 10 nA/mm$^2$, or from 10 nA/mm$^2$ to 100 nA/mm$^2$.

In embodiments of the present disclosure the particle beam provides a broad ion field. The source of the particle beam may be an ion flood source. In an embodiment, the ion flood source does not include focusing lenses. In embodiments, the ion source is operated at less than atmospheric pressure, such as at $10^{-3}$ to $10^{-5}$ torr or $10^{-4}$ to $10^{-6}$ torr.

In embodiments, the interaction of the ions with the graphene sheets creates damage tracks in the basal plane of the stacked graphene sheets. The damage tracks extend through the stacked graphene sheets. Thereafter, the damaged graphene is exposed to a chemical etchant, such as an oxidant, to react defects such as carbon-carbon triple bonds with the oxidant to remove the graphene-based carbon atoms from the damage tracks but not the undamaged graphene adjacent thereto. Illustrative chemical etchants include oxidants such as, for example, ozone, potassium permanganate, sulfuric acid and combinations thereof and modified Hummer's solution. In an embodiment, the oxidant combines NaNO₃, H2SO₄ and KMnO₄. Other strong oxidants may also be suitable and will be recognized by one having ordinary skill in the art. An exemplary etch time is 0.1 to 1 hr at room temperature. In an embodiment, these conditions are suitable for 0.1% modified Hummer's solution.

In embodiments, the pores are functionalized. In some embodiments, the pores are functionalized with oxygen moieties. For example, the etching process may be selected to achieve such functionalization. Subsequently, the oxygen functionalities can be reacted via a chemistry that converts the oxygenated functionalities. In additional embodiments, the pores are functionalized moieties comprising oxygen, nitrogen, phosphorus, sulfur, fluorine, chlorine, bromide, iodine or combinations thereof. In further embodiments, the pores are functionalized with moieties comprising boron, hydrogen, lithium, magnesium, aluminum or combinations thereof. In embodiments, the moieties may be charged moieties, hydrophobic moieties, or hydrophilic moieties. Functionalization may be covalent and/or non-covalent. Various methods for functionalization of graphene are known to the art. For example, Functionalization of Graphene, V. Georgakilis (ed.), Wiley, June 2014 and Chemical Functionalization of Carbon Nanomaterials: Chemistry and Applications, V. Thakur and M. Thakur (eds.), CRC Press, 2015 provide some description of functionalization of graphene and are incorporated herein by reference for description of graphene functionalization methods.

In embodiments, it is desirable and advantageous to perforate multiple graphene sheets at one time rather than perforating single graphene sheets individually, since multi-layer graphene is more robust and less prone to the presence of intrinsic defects than is single-layer graphene. In addition, the process is stepwise efficient, since perforated single-layer graphene can optionally be produced by exfoliating the multi-layer graphene after the pore definition process is completed. The pore size is also tailorable in the processes described herein, since the damage tracks produced by the ion beam are dependent upon the chosen ion and its energy. Thus, the processes described herein are desirable in terms of the number, size and size distribution of pores produced.

The multi-layer graphene contains between about 5 stacked graphene sheets and about 20 stacked graphene sheets according to the various embodiments of the present disclosure. Too few graphene sheets can lead to difficulties in handling the graphene as well as an increased incidence of intrinsic graphene defects. Having more than about 20 stacked graphene sheets, in contrast, can make it difficult to perforate all of the graphene sheets with the ion beam. In an embodiment, the multilayer sheets may be made by individually growing sheets and making multiple transfers to the same substrate. The processes described herein are not believed to be suitable for directly producing single-layer graphene, since the processes described herein directly produce perforated multi-layer graphene. In various embodiments, the multi-layer graphene perforated by the techniques described herein can have 5 graphene sheets, or 6 graphene sheets, or 7 graphene sheets, or 8 graphene sheets, or 9 graphene sheets, or 10 graphene sheets, or 11 graphene sheets, or 12 graphene sheets, or 13 graphene sheets, or 14 graphene sheets, or 15 graphene sheets, or 16 graphene sheets, or 17 graphene sheets, or 18 graphene sheets, or 19 graphene sheets, or 20 graphene sheets. Any subrange between 5 and 20 graphene sheets is also contemplated by the present disclosure.

In various embodiments, the perforated graphene can have pores ranging between about 0.1 nm to about 10 nm in size or from about 0.2 nm to about 2.5 nm in size, as measured carbon center-to-carbon center, which can be desirable for utilization of this material in some filtration applications. In additional embodiments, the pores can range between about 0.2 nm to about 2 nm in size, or from about 0.5 nm to about 1.5 nm in size. In further embodiments, the pores range from 0.3 nm to 50 nm, 0.3 nm to 20 nm, 0.3 nm to 10 nm, 0.5 nm to 2.5 nm, 0.3 nm to 0.5 nm, 0.5 nm to 10 nm, or 5 nm to 20 nm. The pores extend all the way through the stacked graphene sheets.

The ions forming the particle beam can be used to tailor the size of the damage tracks produced upon bombarding the multi-layer graphene. Both the identity of the ions and their energy can influence the size of the damage tracks. In some embodiments, the ions are noble gas ions (ion of an element from Group 18 of the periodic table) or are selected from the group consisting of $Xe^+$ ions, $Ne^+$ ions, or $Ar^+$ ions, In some embodiments, the ions can be xenon ions. In other illustrative embodiments, organic ions or organometallic ions such as tropyllium ions $C_7H_7^+$ and ferrocenium ions $(C_5H_5)_2Fe^+$ can be used. In an embodiment, the organic or organometallic ion has an aromatic component. In an embodiment, the molecular mass of the organic ion or organometallic ion is from 75 to 200 or 90 to 200. The ions can strike the surface at any angle relative to the graphene basal plane, including normal to the basal plane of the top-most graphene sheet.

In some embodiments, the graphene-based material comprising multi-layer graphene is perforated while attached to a substrate. In an embodiment, the substrate is substantially nonporous, so that the graphene based material is supported rather than suspended. In some embodiments the substrate is a growth substrate while in other embodiments the substrate is a secondary substrate to which the graphene-based material is transferred after growth. In an embodiment, the substrate disperses an impact energy of the ions and/or neutralized ions with the substrate into an area of the graphene-based material surrounding the defects created upon interacting the ions and/or neutralized ions with the graphene and promotes expansion of the defects into holes.

In some embodiments, the graphene-based material comprising multi-layer graphene can be perforated while still on its growth substrate, such as a copper substrate. In an embodiment, the growth substrate is a metal growth substrate. In an embodiment, the metal growth substrate is a substantially continuous layer of metal rather than a grid or mesh. Metal growth substrates compatible with growth of graphene and graphene-based materials include transition metals and their alloys. In embodiments, the metal growth substrate is copper based or nickel based. Specifically, the damage tracks can be produced in the graphene enhanced by the substrate and then opened with the etchant. Thereafter, the graphene can be removed from the growth substrate (e.g., by ammonium persulfate etching) and transferred to a secondary substrate, such as a porous polymer or an inorganic membrane. Optionally, the graphene can be removed from the growth substrate before expanding the damage tracks or at the same time as expanding the damage tracks. Again, the greater stability of multi-layer graphene offers considerable flexibility in both the nature of the graphene product and how it is produced. The presence of the graphene on the substrate can also enhance the perforation and etching process.

In some embodiments, perforated graphene produced by the techniques described herein can be used in filtration processes. In addition, the perforated graphene produced by the techniques described herein can be utilized in fields such as, for example, advanced sensors, batteries and other electrical storage devices, and semiconductor devices.

In some embodiments, the perforated graphene can be placed upon a porous polymer substrate after being perforated. The combination of the porous polymer substrate and the graphene can constitute a filter in various embodiments, such as a reverse osmosis filter. Suitable porous polymer substrates are not believed to be particularly limited.

Figure 2:
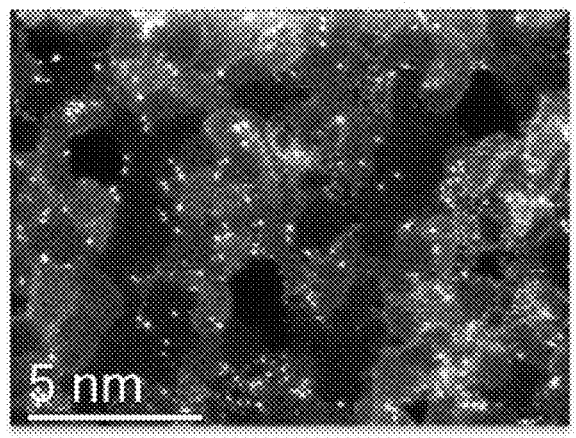
FIG. 2 shows an illustrative image of a perforated multilayer graphene produced by the techniques of the present disclosure.

FIG. 1 shows an illustrative schematic demonstrating how pores can be selectively introduced into a plurality of stacked graphene sheets according to the processes of the present disclosure. As shown in FIG. 1, a multi-layer graphene is exposed to an ion beam to produce a damage track therein. Thereafter, the carbon atoms in the damage track are removed by selective chemical etching to produce the perforated graphene having pores defined therethrough. Subsequently, the graphene can be removed from a substrate (not shown). FIG. 2 shows an illustrative microscopy image of a perforated multi-layer graphene produced by the techniques of the present disclosure.

Although the disclosure has been described with reference to the disclosed embodiments, one having ordinary skill in the art will readily appreciate that these are only illustrative of the disclosure. It should be understood that various modifications can be made without departing from the spirit of the disclosure. The disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. One of ordinary skill in the art will appreciate that methods, device elements, starting materials and synthetic methods other than those specifically exemplified can be employed in the practice of the invention without resort to undue experimentation. All art-known functional equivalents, of any such methods, device elements, starting materials and synthetic methods are intended to be included in this invention. Whenever a range is given in the specification, for example, a temperature range, a time range, or a composition range, all intermediate ranges and subranges, as well as all individual values included in the ranges given are intended to be included in the disclosure. When a Markush group or other grouping is used herein, all individual members of the group and all combinations and subcombinations possible of the group are intended to be individually included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The preceding definitions are provided to clarify their specific use in the context of the invention.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claims.

What is claimed is the following:
1. A method comprising:
   providing a sheet of graphene-based material comprising multi-layer graphene having between about 10 and about 20 graphene layers;
   exposing the sheet of graphene-based material comprising multi-layer graphene to a particle beam having an ion energy of at least about 1500 eV to produce a plurality of damage tracks in the multi-layer graphene, the damage tracks extending entirely through the basal planes of the multiple graphene sheets; and
   exposing the sheet of graphene-based material comprising multi-layer graphene to a chemical etchant to remove carbon atoms from the graphene at the damage tracks and open a plurality of pores extending through the multiple graphene sheets.

2. The method of claim 1, wherein the chemical etchant is an oxidant.

3. The method of claim 2, wherein the oxidant is selected from the group consisting of ozone, an aqueous solution of potassium permanganate, an aqueous solution of potassium permanganate and sulfuric acid, an aqueous solution of potassium permanganate and potassium hydroxide and a solution of hydrogen peroxide and sulfuric acid.

4. The method of claim 1, wherein the ion energy is greater than 1.5 keV and less than 100 keV.

5. The method of claim 1, wherein the ion energy is greater than 1.5 keV and less than 10 keV.

6. The method of claim 1, wherein the particle beam comprises ions selected from the group consisting of $Xe^+$ ions, $Ne^+$ ions and $Ar^+$ ions.

7. The method of claim 1, wherein the particle beam comprises xenon ions.

8. The method of claim 1, wherein the particle beam comprises ions selected from the group consisting of tropyllium ions and ferrocenium ions.

9. The method of claim 1, wherein the graphene is disposed on a substrate when producing the damage tracks.

10. The method of claim 9, wherein the substrate is a metal growth substrate.

11. A sheet of graphene-based material comprising multi-layer graphene having from 10 to 20 graphene layers and comprising a plurality of pores extending therethrough.

12. The sheet of graphene-based material of claim 11, wherein the size of the pores is less than or equal to 50 nm.

13. The sheet of graphene-based material of claim 11, wherein the pores range from 0.2 nm to 50 nm in size.

14. The sheet of graphene-based material of claim 11, wherein the pores range from 0.3 nm to 50 nm in size.

15. The sheet of graphene-based material of claim 11, wherein the sheet of graphene-based material is prepared by providing a sheet of graphene-based material comprising multi-layer graphene having between about 10 and about 20 graphene layers;

exposing the sheet of graphene-based material comprising multi-layer graphene to a particle beam having an ion energy of at least about 1500 eV to produce a plurality of damage tracks in the multi-layer graphene, the damage tracks extending entirely through the basal planes of the multiple graphene sheets; and exposing the sheet of graphene-based material comprising multi-layer graphene to a chemical etchant to remove carbon atoms from the graphene at the damage tracks and open a plurality of pores extending through the multiple graphene sheets.

16. The sheet of graphene-based material of claim 11, wherein the sheet of graphene-based material is prepared by providing a sheet of graphene-based material comprising multi-layer graphene having between about 10 and about 20 graphene layers;

exposing the sheet of graphene-based material comprising multi-layer graphene to a particle beam having an ion energy of at least about 1500 eV to produce a plurality of damage tracks in the multi-layer graphene, the damage tracks extending entirely through the basal planes of the multiple graphene sheets; and exposing the sheet of graphene-based material comprising multi-layer graphene to a chemical etchant to remove carbon atoms from the graphene at the damage tracks and open a plurality of pores extending through the multiple graphene sheets, wherein the graphene is disposed on a substrate when producing the damage tracks.

* * * * *